United States Patent
Smith et al.

(10) Patent No.: US 7,868,358 B2
(45) Date of Patent: Jan. 11, 2011

(54) COILED CIRCUIT DEVICE WITH ACTIVE CIRCUITRY AND METHODS FOR MAKING THE SAME

(75) Inventors: Joseph Smith, Columbia, MA (US); Harvey C. Nathanson, Pittsburgh, PA (US); Robert S. Howell, Silver Spring, MD (US); Christopher F. Kirby, Gambrills, MD (US); Garrett A. Storaska, Reston, VA (US)

(73) Assignee: Northrop Grumman Systems Corporation, Los Angeles, CA (US)

(*) Notice: Subject to any disclaimer, the term of this patent is extended or adjusted under 35 U.S.C. 154(b) by 597 days.

(21) Appl. No.: 11/653,964

(22) Filed: Jan. 17, 2007

(65) Prior Publication Data

US 2007/0117392 A1   May 24, 2007

Related U.S. Application Data

(63) Continuation-in-part of application No. 10/861,885, filed on Jun. 7, 2004, now Pat. No. 7,488,994.

(60) Provisional application No. 60/476,200, filed on Jun. 6, 2003, provisional application No. 60/532,175, filed on Dec. 24, 2003.

(51) Int. Cl.
 *H01L 27/10* (2006.01)
(52) U.S. Cl. .............. 257/203; 257/315; 257/692; 257/693
(58) Field of Classification Search ............ 257/203, 257/315, 692, 693
See application file for complete search history.

(56) References Cited

U.S. PATENT DOCUMENTS

| | | | |
|---|---|---|---|
| 4,510,551 A * | 4/1985 | Brainard, II | 361/679.31 |
| 6,051,877 A | 4/2000 | Usami et al. | |
| 6,183,267 B1 | 2/2001 | Marcus et al. | |
| 6,464,687 B1 | 10/2002 | Ishikawa et al. | |
| 6,798,200 B2 | 9/2004 | Fan | |
| 2002/0018334 A1 | 2/2002 | Hill et al. | |
| 2002/0125545 A1 | 9/2002 | Kano et al. | |
| 2002/0163414 A1 | 11/2002 | Mayer et al. | |
| 2003/0057525 A1 | 3/2003 | Fock et al. | |

FOREIGN PATENT DOCUMENTS

CA   2305069   10/2001

(Continued)

OTHER PUBLICATIONS

Cho, Adrian, "Pretty as you please, curling films turn themselves into nanodevices", Jul. 14, 2006, Science vol. 313, www.sciencemag.org.
Celler, G.K., et al, Frontiers of silicon-on-insulator, J. Applied Physics, May 1, 2003, 4955-4978, vol. 93, No. 9.

(Continued)

*Primary Examiner*—Thien F Tran
(74) *Attorney, Agent, or Firm*—Andrews Kurth LLP

(57) ABSTRACT

A device includes a coiling layer, a circuit device layer and active microelectronic circuitry fabricated on the circuit device layer. The coiling layer is formed onto a surface of and coupled to the circuit device layer. The coiling layer having intrinsic stresses which cause coiling of the coiling layer and the circuit device layer including the microelectronic circuitry as the circuit device layer is released from an underlying substrate. A coiled circuit device is formed.

16 Claims, 23 Drawing Sheets

FOREIGN PATENT DOCUMENTS

| | | |
|---|---|---|
| EP | 1231617 | 8/2002 |
| EP | 1241507 | 9/2002 |
| JP | 6-125153 * | 5/1994 |
| WO | WO 01/81173 | 11/2001 |
| WO | WO 01/88612 | 11/2001 |
| WO | WO 02/36486 | 5/2002 |

OTHER PUBLICATIONS

Gill, John J., et al., "Manufacturing issues of thin film NiTi microwrapper, Sensors and Actuators", Elsevier Sequoia, S.A., Lausanne, Ch., Sep. 30, 2001, 148-156, vol. 93, No. 2.
International Search Report, PCT/US2004/017952, Jul. 6, 2004.
Written Opinion, PCT/US2004/017952, Jul. 6, 2004.

* cited by examiner

TURN OVER BONDED PAIR AND REMOVE Si SUBSTRATE FROM WAFER 1 TO DOTTED LINE; THEN REMOVE BOX.

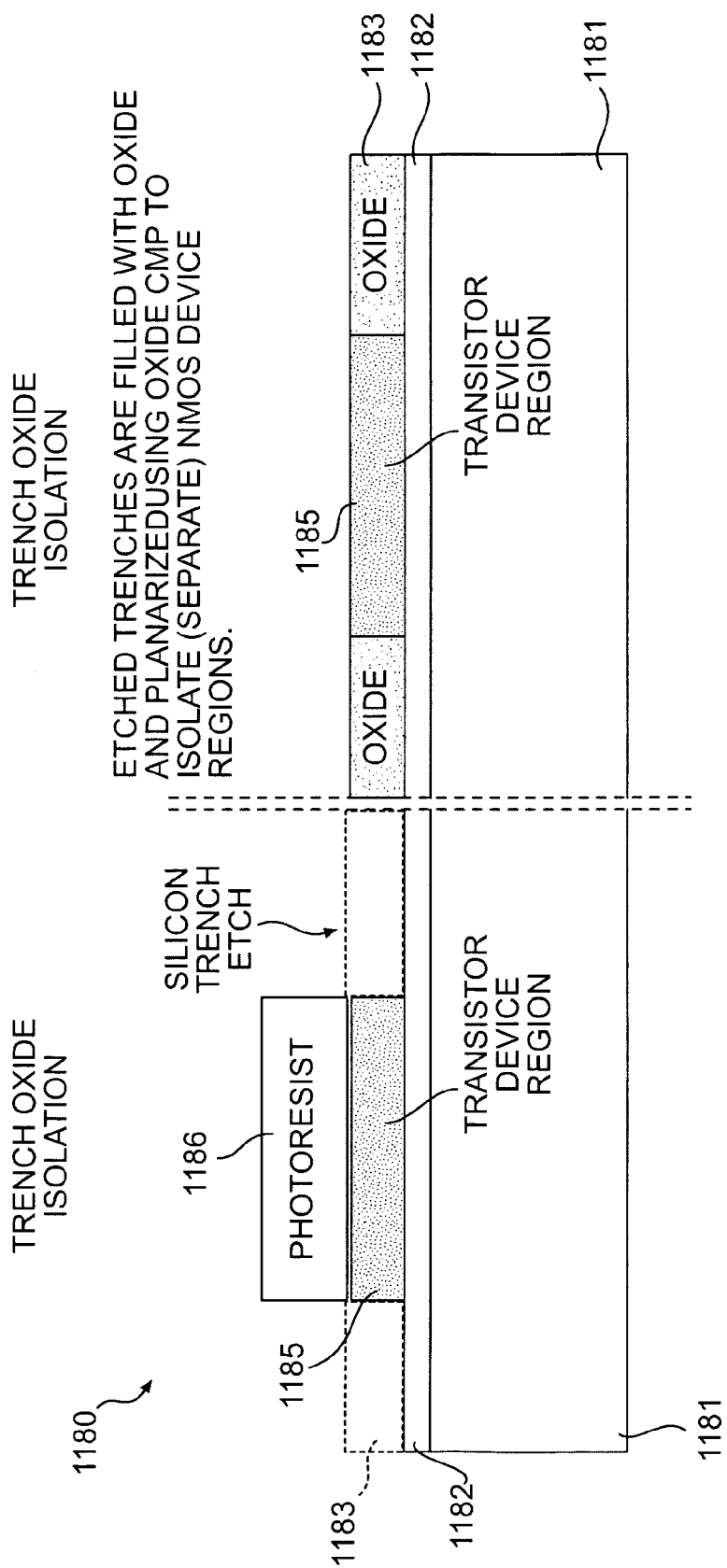

COILED CIRCUIT DEVICE WITH ACTIVE CIRCUITRY AND METHODS FOR MAKING THE SAME

REFERENCE TO RELATED APPLICATION

This application is a continuation-in-part (CIP), under 35 U.S.C. §120, of U.S. application Ser. No. 10/861,885, entitled "Coiled Circuit Device and Method of Making the Same," filed Jun. 7, 2004 now U.S. Pat. No. 7,488,994, which claims priority under 35 U.S.C. §119 (e) to U.S. Provisional application No. 60/476,200, filed on Jun. 6, 2003, and to U.S. Provisional application No. 60/532,175, filed on Dec. 24, 2003, all of which are incorporated herein by reference in their entirety.

FIELD OF THE INVENTION

The present invention is generally directed to integrated circuits. More particularly, the present invention is directed to coiled active circuit devices and methods for making the same.

BACKGROUND OF THE INVENTION

The information age has significantly increased the need for miniature electronic devices. Tremendous demand exists for portable electronic devices, such as digital cameras, digital camcorders, laptops and other similar products. Devices that are small and fully functional with processing, power, information gathering and storing capabilities built in are desirable.

Using current semiconductor process technology, an incredible amount of functionality can be integrated onto a single, large silicon die. This single die can now contain an entire system on a chip, such as an entire computer or, a cell phone. However, one of constraints affecting further miniaturization is the thickness of the silicon substitute that the integrated circuit is manufactured on.

Applications for miniature devices are countless including commercial applications, such as cameras, communication devices, computers, etc.

SUMMARY OF THE INVENTION

A device includes a coiling layer, a circuit device layer and active microelectronic circuitry fabricated on the circuit device layer. The coiling layer is formed onto a surface of and coupled to the circuit device layer. The coiling layer having intrinsic stresses which cause coiling of the coiling layer and the circuit device layer including the microelectronic circuitry as the circuit device layer is released from an underlying substrate. A coiled circuit device is formed.

A coiled sensor including a coiled device layer that forms a plurality of concentric cylinders. The coiled device layer is at or between 50 nanometers and 75 nanometers thick and includes a power supply, a memory, a processor, and a transmitter or receiver. An outer diameter of the coiled sensor is at or between 75 to 150 micrometers and a length is at or between 1 millimeter and 10 millimeters, when coiled.

BRIEF DESCRIPTION OF THE DRAWINGS

FIGS. 11A and 11B illustrate a method for integrated circuit formation for a coiled active circuit device in accordance with an embodiment.

DETAILED DESCRIPTION

Figure 1:
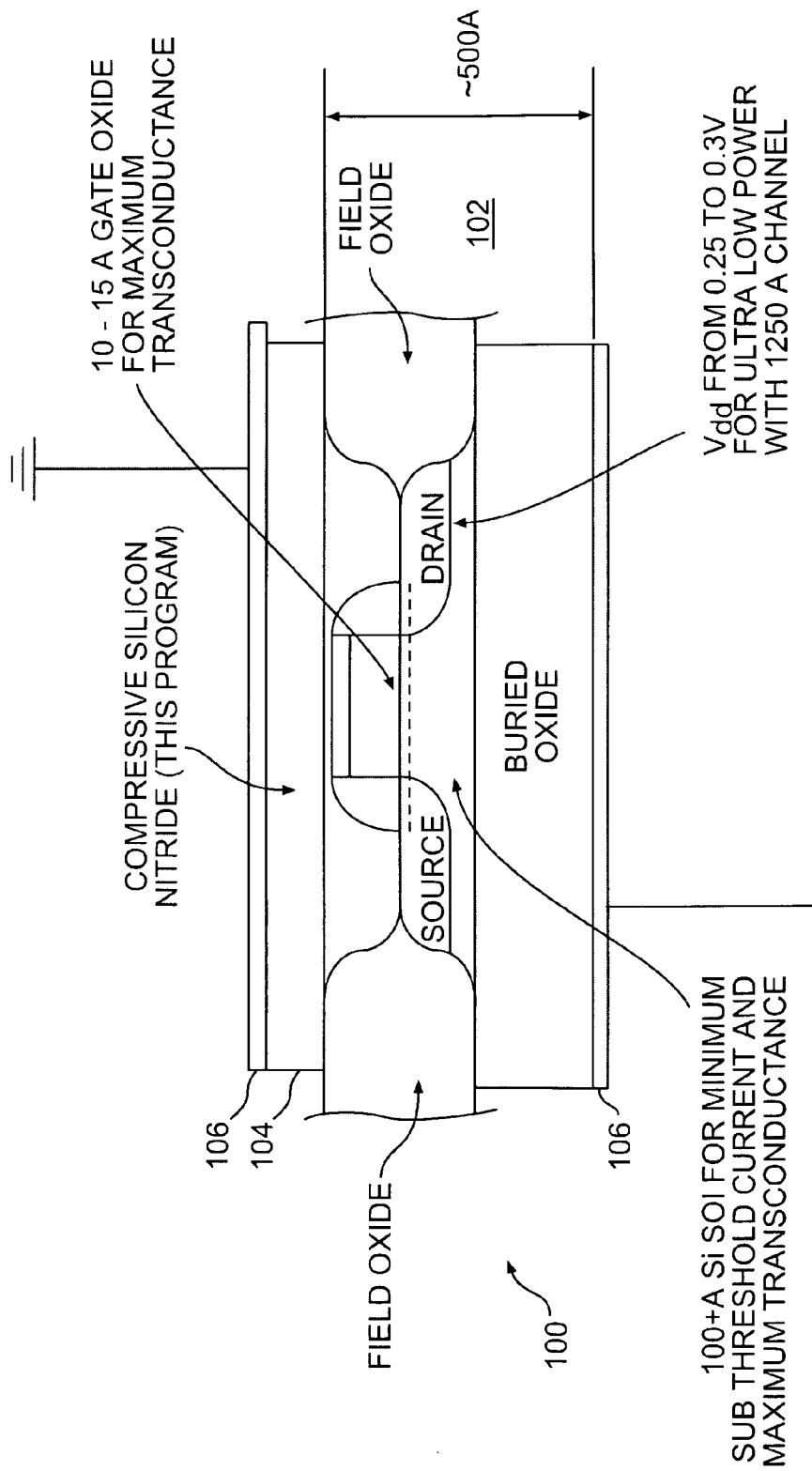
FIG. 1 is shows a side view of a device which may be coiled according to an embodiment of the invention.

In standard planar semiconductor processing techniques, information density is achieved by scaling down the transistor gate lengths and therefore the device foot print. Thus allowing the devices to be packed in to active area/volume (surface-to-volume ratio) device densities of at most 100 $cm^{-1}$. However, the active area of the device is typically only a few thousand angstroms in depth, and therefore, the substrate thickness of approximately 100 μm needed for mechanical support, is largely wasted volume. In other words, only a thin layer on the surface of each silicon die is electrically active.

An embodiment of the present invention is a silicon die layered with active circuitry formed into a coiled circuit device. The coiled active circuit device may provide a self contained system or device that, while extremely small, may offer many features, such as data sensing, storing, processing, and data transmission or reception, or both. The coiled active circuit device may include various other components and features. The coiled device may include, for example, memory, processor(s), communication devices, power generation and storage, camera(s), battery systems, sensors, transmitters, logic gates, analog or digital circuits, antennas, microphones, speakers, or other devices and components.

In an embodiment, an underlying base or die including a device layer is formed. Active circuitry is fabricated on the base device layer. The active portion of the base including the active circuitry is "skimmed off" or released, and the device is coiled or curled into an extremely compact small tightly wound coil. The coiled active circuit device may be of any size. In one embodiment, the coiled active circuit device diameter is approximately equal to the diameter of a human hair. The active device layer of the base used for fabricating the active circuitry may be, for example, single crystal silicon or poly-silicon, or a combination of both, which maintains the electrical properties of the underlying base or die. In other words, the single crystal silicon skimmed off has the same electrical properties as the larger silicon base, and can be used to deposit active circuitry. The single crystal silicon layer with active circuitry may be released from the underlying substrate material and curled into a compact coil. Also, polycrystalline silicon thin films, released from the underlying substrate, may be used for the active portion of the die used for fabricating the active circuitry.

The coiled circuit configuration described herein may achieve on the order of 1,000 to 10,000 times increase in the surface/volume ratio as compared with conventional top planar technology. The resulting coiled circuit may provide a "system-on-a-chip," an application specific sensor, or other device which can be so small that it is virtually imperceptible.

The technology and methods as described in U.S. patent application Ser. No. 10/861,885, incorporated herein by reference in its entirety, provide additional techniques and details that may be applicable to the coiled circuit configuration as described herein.

FIG. 1 shows a side view of a device which may be coiled according to an embodiment. The device 100 includes a circuit layer 102, a coiling layer 104, and outer electrical insulation and metal interconnect layers 106. The circuit layer 102 may include active circuitry that may form, for example, storage memory, processor(s), communication devices, sensors, power systems, logic gates and circuits, analog or digital circuitry, antennas, speakers or the like.

The circuit layer 102 may include thin silicon on insulator metal oxide semiconductor (SOI MOS) technology or other technologies. In an embodiment, a very thin layer (<100 nm), on the surface of the underlying base, may be used for the microelectronic fabrication. For example, extremely thin silicon metal oxide semiconductor (MOS) technology, such as complementary metal oxide semiconductor (CMOS) technology, which uses less than 10 nm of silicon may be used. As shown in FIG. 1, the total device thickness using extremely thin MOS memory cell technology is only approximately 50 nm (500 Å). Removal of this thin layer from the substrate and coiling it into a cylinder, containing only the active portions of the circuit, may provide an approximate 1000 times improvement (reduction) in the volume of the circuitry. The improvement in surface area/volume can be leveraged to incorporate a correspondingly higher amount of energy storage (described below), while producing a device that may be similar in size, shape, and diameter to a human hair.

The circuit layer 102 may also include other material, such as silicon, silicon geranium, polysilicon, thermal and deposited oxides, and selective doping material to form integrated circuitry.

A coiling layer 104, such as but not limited to a stressed or compressive silicon nitride ($Si_3N_4$), may be included in the device to facilitate coiling of the device 100. The atoms of the coiling layer are in constant tension, causing the coiling layer 104, the circuit layer 102 and the interconnect layers, for example, to coil around the coiling layer, when released from the underlying substrate. The interconnect layers 106 may be a conductor, containing materials such as copper, gold or aluminum, or any combination thereof. Further, silicon nitride is known to capture a charge and therefore, an alternative insulator may be helpful in reducing the effects a nitride layer may have upon the circuit layer.

Thin MOS memory circuit technology is described in co-owned U.S. Pat. No. 5,969,385 entitled, "Ultra-low Power-Delay Product NNN/PPP Logic Devices," the complete contents of which are incorporated herein by reference. Some non-limiting features of thin MOS technology can include: 100+ Å Si, SOI for minimum sub-threshold current and maximum transconductance; an accumulation mode for predictable, low thresholds and minimum gate tunneling; 10-15 Å gate oxide for maximum transconductance; and SiGe amorphization ohmics for minimum source-drain resistance.

FIG. 1 only shows a portion of device 100, however, as described below, circuitry can be fabricated onto wafers in sheets or strips (see, e.g., FIG. 2), and then coiled using different curling processes. Therefore, reference may also be made to device 100 as a "sheet" through out this document. Thin MOS technology allows a workable geometry for the present invention and the creation of suitable sheets of active circuitry; however, other technologies, such as Gallium Arsenic (GaAs), Gallium Nitride (GaN), Silicon Germanium (SiGe), or Silicon bipolar devices, may be used to create the active circuitry the substrate, which may be coiled as described herein.

In one example, each of the layers of the sheet 100 may be fabricated such that the total thickness of the sheet 100 is approximately between 1000 and 1500 Å. Of course, the coiled memory device can be made larger or smaller in size in order to achieve the desired volume, speed, capacity, capabilities, etc.

Figure 2:
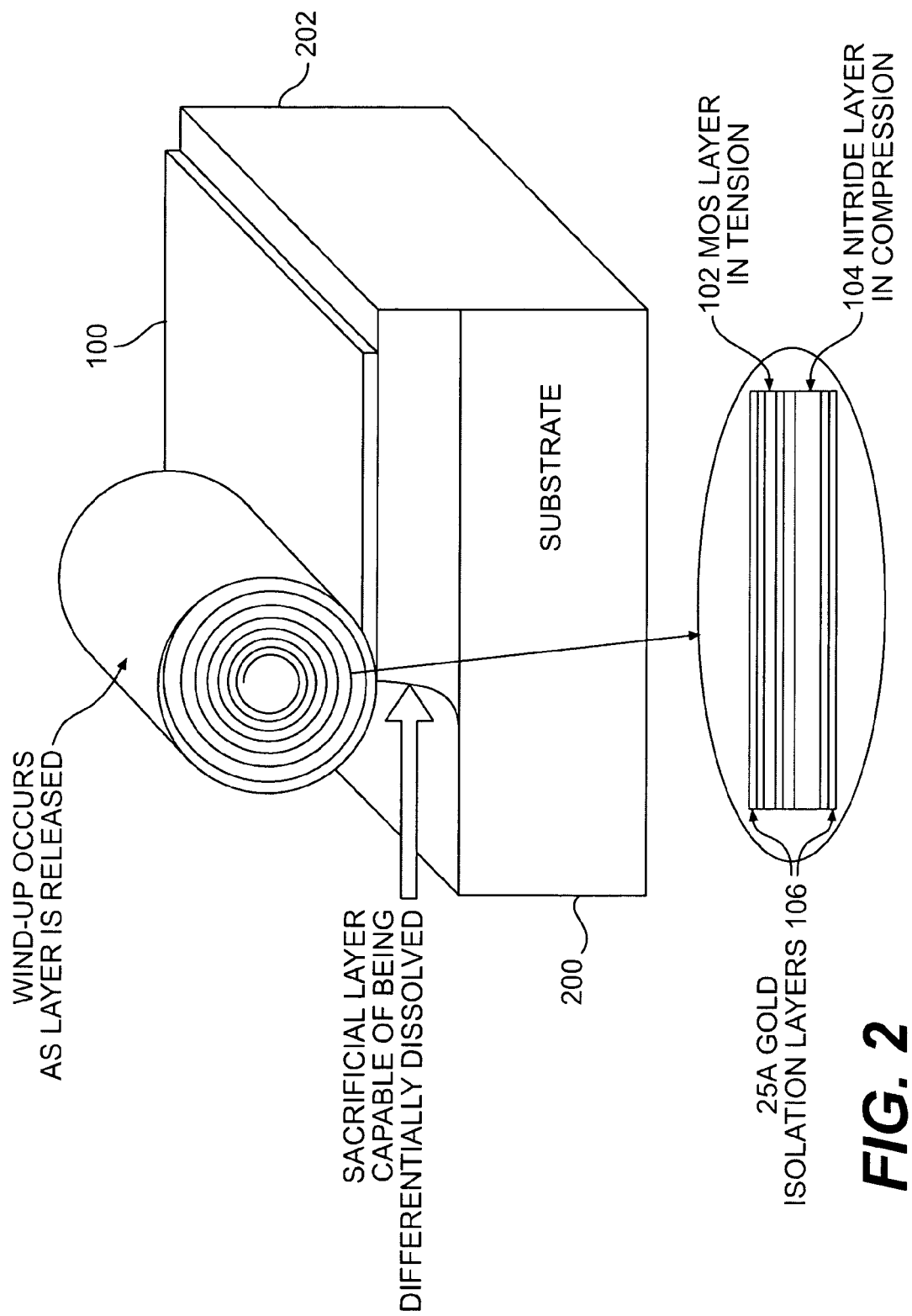
FIG. 2 is a perspective view of a coiled active circuit device in accordance with an embodiment.

FIG. 2 shows a perspective view of a coiled active circuit device 100 according to an embodiment. Device 100, including the coiling layer 104 and the circuit layer 102, is fabricated onto a wafer or substrate 200, and on top of a sacrificial layer 202. As shown, the sacrificial layer 202 is gradually removed, during which the coiling layer 104 forces the device 100 to coil. Coiling layer 104 may be in compression while the circuit layer 102 may be in tension. Circuit layer 102 contracts at a different rate than the coiling layer 104, from the original coiling layer forcing the device 100 to coil as the sacrificial layer is removed. The sacrificial layer 202 can be gradually removed until the device 100 is completely coiled into a substantially cylindrical shape. As will be discussed in further detail below, the device 100 may be fabricated to adjust the radius of coil.

As described above, the coiled active circuit device process uses the electronic circuit layer that lies within a thin layer on top of a much thicker substrate, for example. The 1000× times increase in the surface/volume ratio may be achieved as a result of the coiling of the top active layer. In addition, a corresponding reduction in the parasitic capacitive coupling between the coiled circuit area and the substrate may result.

Figure 3:
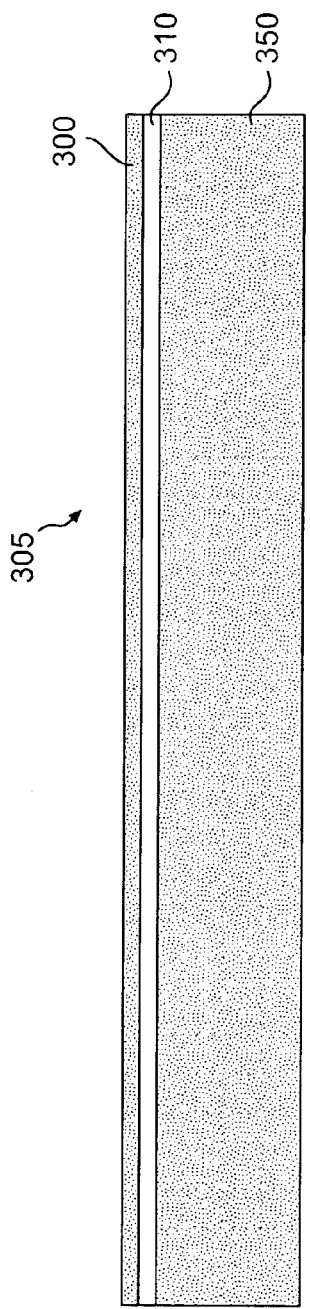
FIGS. 3-5 illustrate a method for fabricating a base for a coiled active circuit device in accordance with an embodiment.
Figure 4:
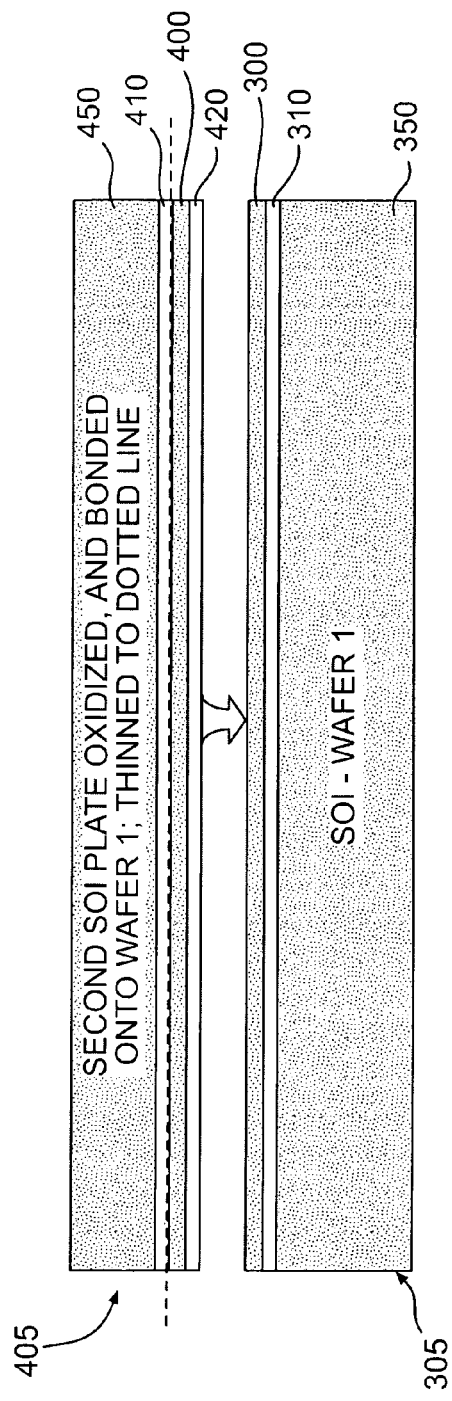
Figure 5:
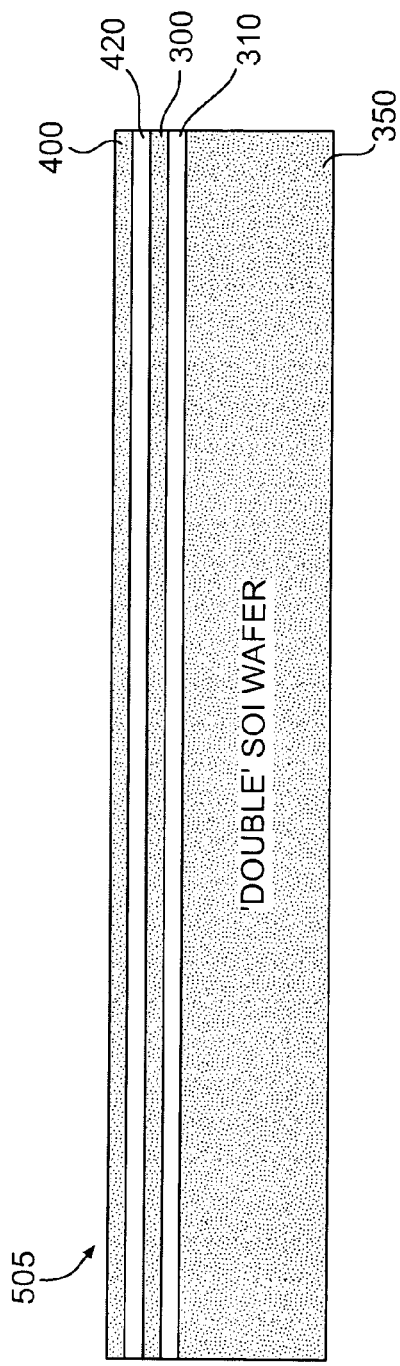

FIGS. 3-5 illustrate a method for fabricating a base for a coiled active circuit device in accordance with an embodiment. FIG. 3 shows a silicon on insulator (SOI) wafer 305, which includes silicon layer 300, silicon dioxide layer 310 and substrate layer 350. The silicon layer 300 may be a single crystal silicon layer or polycrystalline silicon thin film. In this example, silicon layer 300 may be approximately 1000 angstroms (Å) thick and maintains its electrical properties. Silicon dioxide 310 deposited between silicon 300 and substrate 350 may be approximately 500 Å thick, while the substrate 350 may be approximately 700 µm thick. The measurements provided herein are given by way of example only, and these measurements may be varied as desirable.

FIG. 4 illustrates a second SOI wafer 405 deposited on the SOI wafer 305. The second SOI wafer 405 includes substrate layer 450, silicon dioxide layer 410 and silicon device layer 400. The SOI wafer 405 may also include a second silicon dioxide layer 420. As shown, SOI 405 is bonded with SOI 305. The substrate 450 is removed by lapping or etching at the buried silicon oxide 410 (at the dotted lines shown in FIG. 4). After the buried silicon oxide 410 is removed, a double silicon on insulator (DSOI) wafer 505 is formed, as shown in FIG. 5.

In accordance with an embodiment, the SOI 305 or DSOI wafer 505, or both, may be used as the underlying base, for the coiled circuit device, on which active circuitry may be fabricated. The active circuitry may be fabricated on the device layer 300 or 400 in accordance with an embodiment of the invention.

Figure 6:
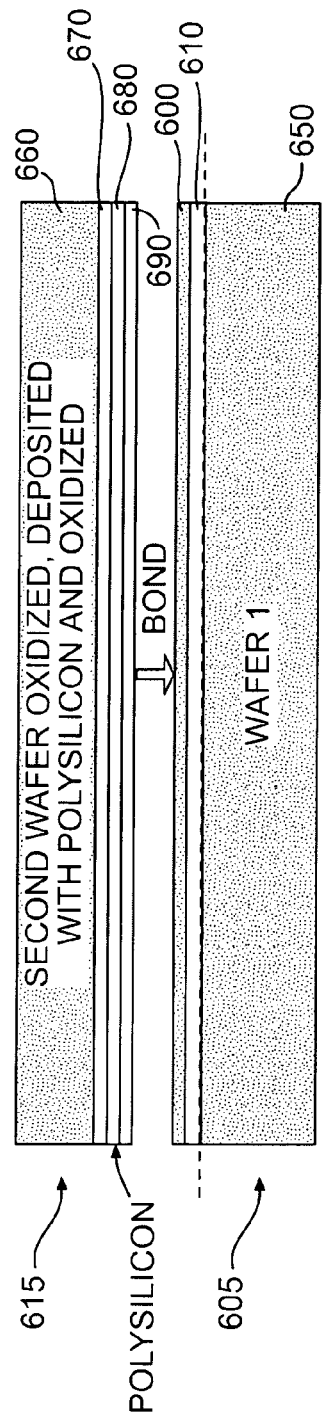
FIGS. 6-7 illustrate a method for fabricating a base for a coiled active circuit device in accordance with an embodiment.
Figure 7:
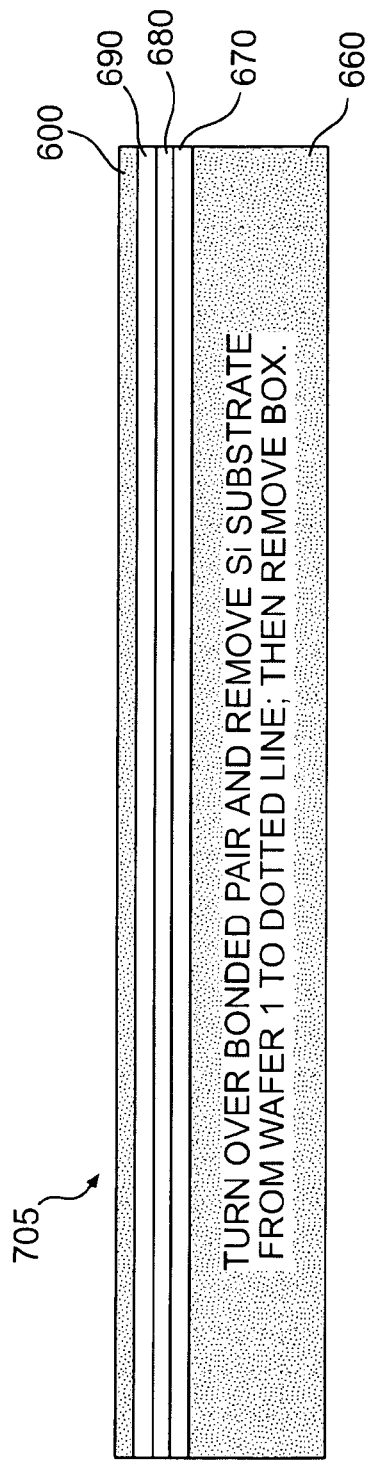

FIGS. 6-7 illustrate an alternative method for fabricating a base for a coiled active circuit device in accordance with an embodiment. As shown, SOI wafer 605 includes silicon device layer 600, silicon dioxide layer 610, and substrate layer 650. SOI wafer 605 is bonded with wafer 615 which includes substrate layer 660, silicon dioxide layer 670, poly-silicon layer 680 and silicon dioxide layer 690. After wafer 615 is bonded with SOI wafer 605, substrate 650 is removed by lapping or etching at the buried silicon oxide 610. After the buried silicon oxide 610 is removed, a wafer 705 with a poly-silicon layer 680 and a silicon layer 600 is formed, as shown in FIG. 7. In accordance with an embodiment, the silicon on poly-silicon wafer 705 may be used as the base, for the coiled circuit device, on which active circuitry may be fabricated. The active circuitry may be fabricated on the device layer 600 in accordance with an embodiment of the invention.

Figure 8:
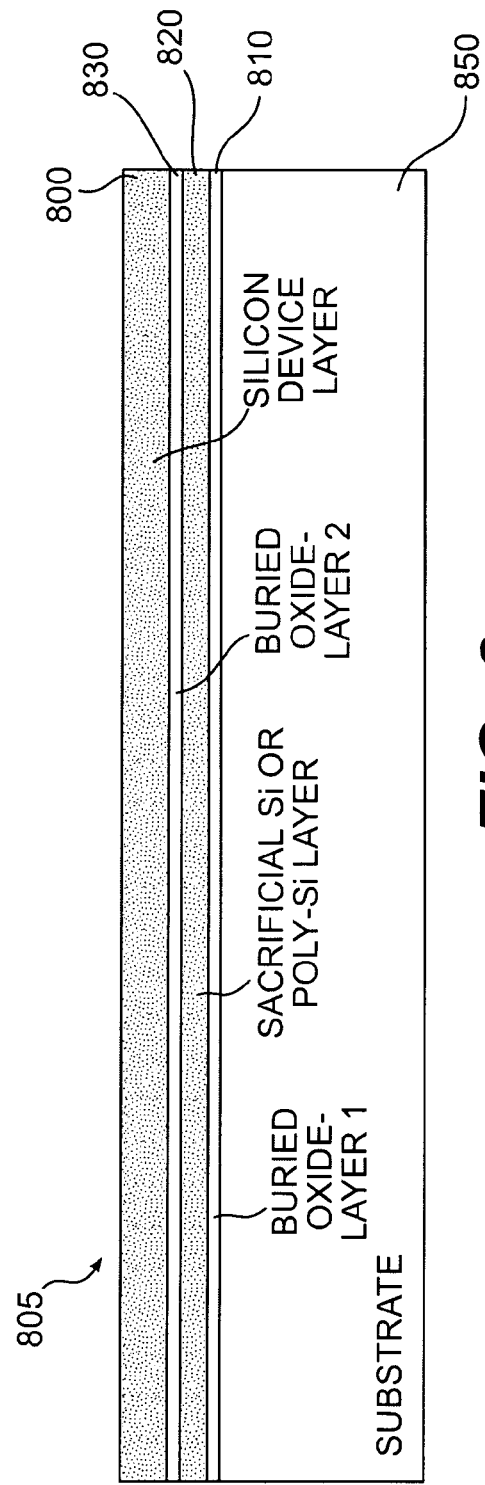
FIG. 8 illustrates a base for a coiled active circuit device.

FIG. 8 illustrates a base 805 for a coiled active circuit device. Base 805 is a double SOI wafer which includes an underlying substrate 850, a first buried silicon oxide layer 810, a sacrificial silicon or poly-silicon layer 820, a second buried oxide layer 830 and a silicon device layer 800. The wafer 805 may be fabricated in accordance with the methods described herein. In accordance with an embodiment, wafer 805 may be used as the base, for the coiled circuit device, on which active circuitry may be fabricated on device layer 800.

Figure 9:
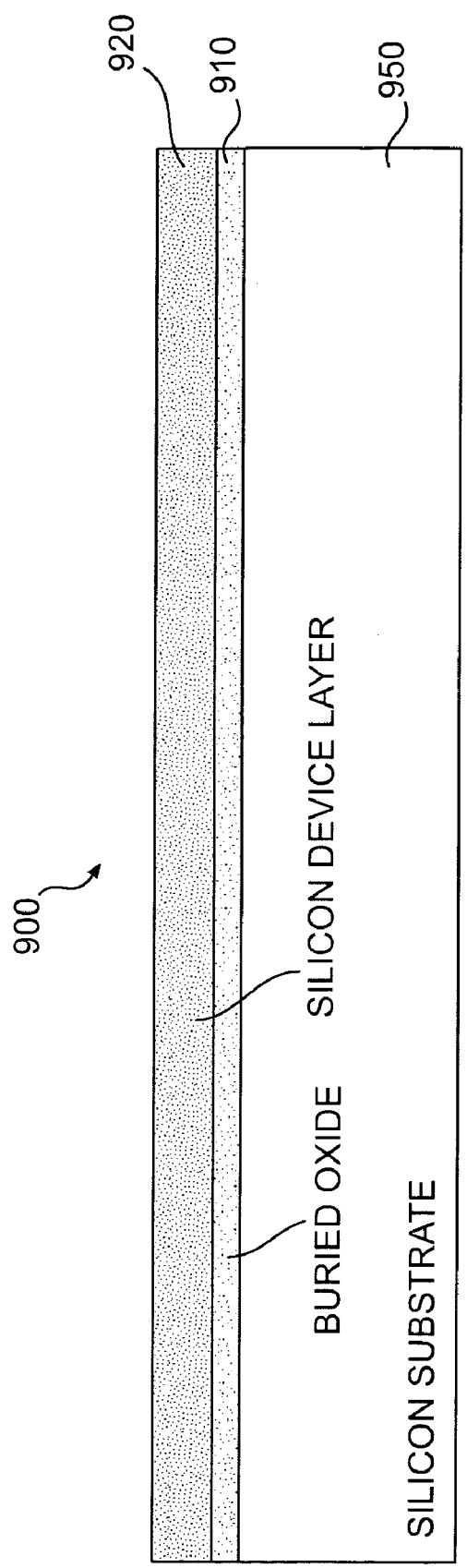
FIG. 9 illustrates a base for a coiled active circuit device.

FIG. 9 illustrates an alternative base for a coiled active circuit device. Base 900 is a single SOI wafer in accordance with an embodiment. Wafer 900 includes an underlying substrate 950, a first buried silicon oxide layer 910 and a silicon device layer 920. The wafer 900 may be fabricated in accordance with methods described herein. In accordance with an embodiment, single SOI wafer 900 described herein may be used as the base, for the coiled circuit device, on which active circuitry may be fabricated on device layer 920.

Figures 10A, 10B:
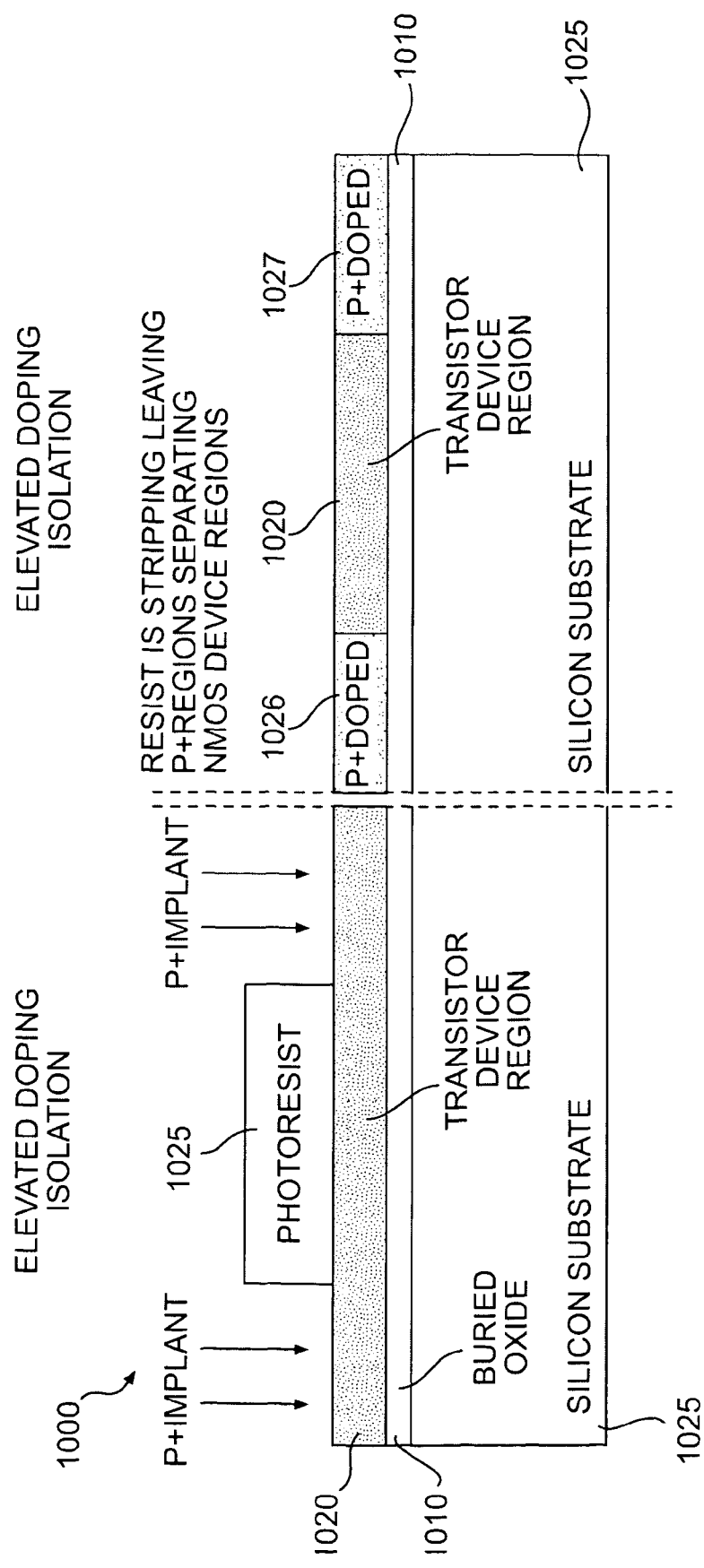
FIGS. 10A and 10B illustrate a method for integrated circuit formation for a coiled active circuit device in accordance with an embodiment.

FIGS. 10 illustrates a method for integrated circuit formation (e.g., forming the active circuitry) for a coiled active circuit device, in accordance with an embodiment. Specifically, FIGS. 10A and 10B show an elevated doping isolation technique that may be used for transistor isolation to form the active circuitry for the coiled active circuit device. FIG. 10A shows device 1000 that includes a silicon substrate 1050, buried oxide 1010 and a silicon device layer 1020. A photoresist layer 1025 is deposited on the device layer 1020 as shown. The device layer 1020 is positively (P+) doped creating positive (P+) regions 1026 and 1027, as shown in FIGS. 10A and 10B. The photo resist layer 1025 is stripped leaving a P+ regions 1026 and 1027 separating the NMOS (negative-channel metal oxide semiconductor) device region 1020.

FIGS. 11 illustrates an alternative method for integrated circuit formation (e.g., forming the active circuitry) for a coiled active circuit device isolation, in accordance with an embodiment. FIGS. 11A and 11B show a trench or LOCOS oxide isolation technique that may be used for transistor isolation to form the active circuitry for the coiled active circuit device. FIG. 11A shows device 1180 that includes a silicon substrate 1181, buried oxide 1182 and a silicon device layer 1185. A photoresist layer 1186 is deposited on the device layer 1185 as shown. Silicon isolation trench etching is used to remove portions of the device layer 1185. The etched trenches 1183 are filled with oxide, and planarized using oxide Chemical-Mechanical Polishing (CMP) to isolate (separate) NMOS device region 1185. The photoresist layer 1186 is stripped leaving a oxide regions 1183 separating the NMOS device region 1185.

Figure 12:
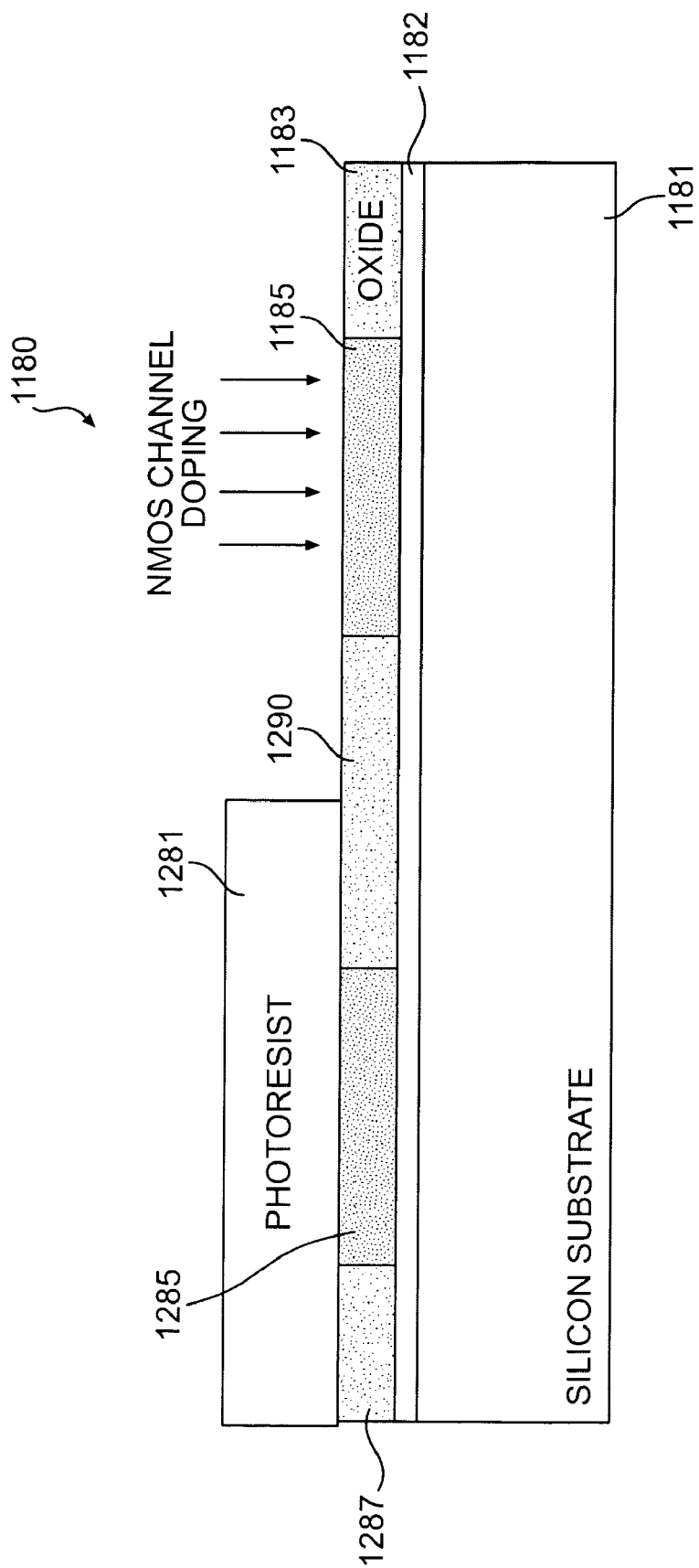
FIGS. 12-19 illustrate methods for forming a coiled active circuit device in accordance with an embodiment.

FIGS. 12-19 illustrate methods for forming a coiled active circuit device in accordance with an embodiment. FIG. 12 illustrates further processing of device 1180 using the trench oxide isolation technique. As shown, photoresist layer 1280 is deposited on the silicon device layer 1285, region 1287 and portions of region 1290. NMOS channel doping is applied to the silicon device layer 1185 to create NMOS device channel regions to set a first threshold voltage for the device 1180. The photoresist layer 1280 is subsequently stripped.

Figure 13:
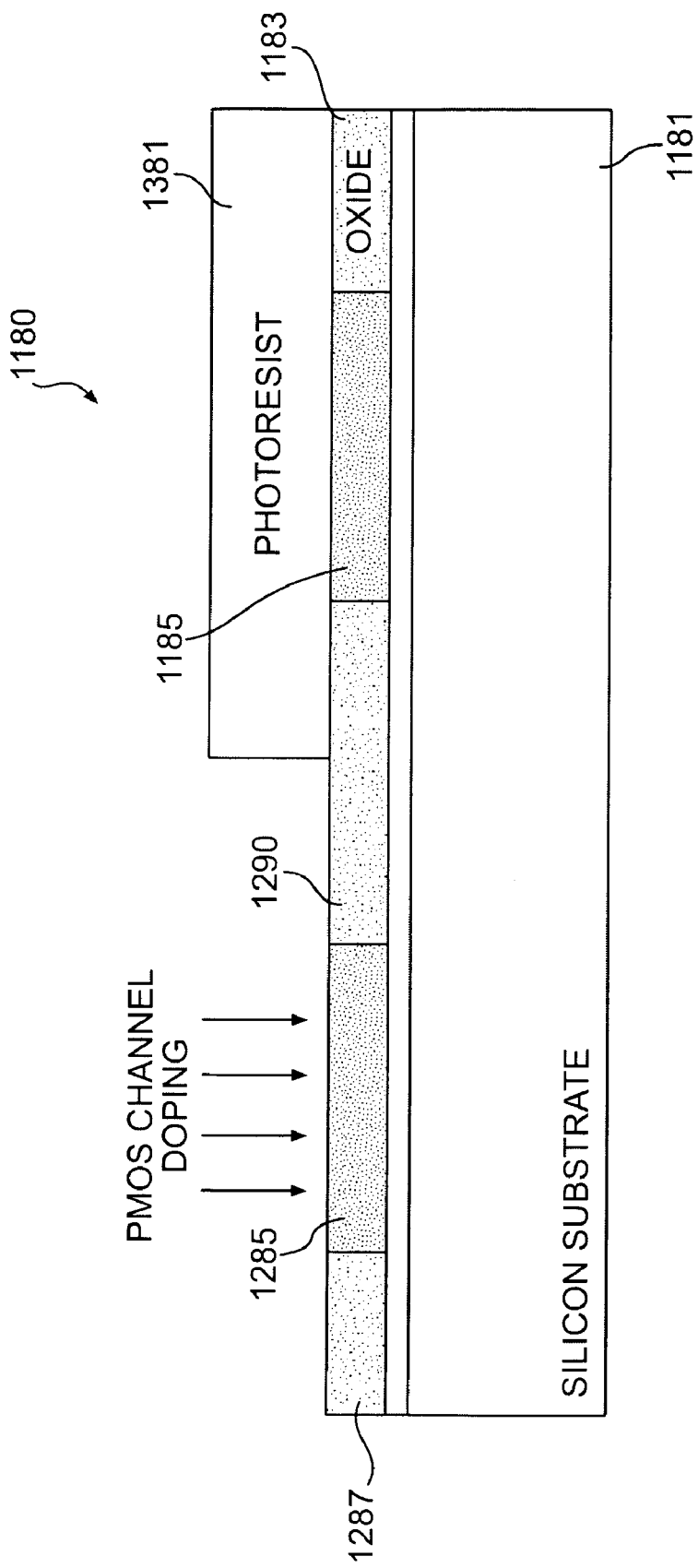
Figure 14:
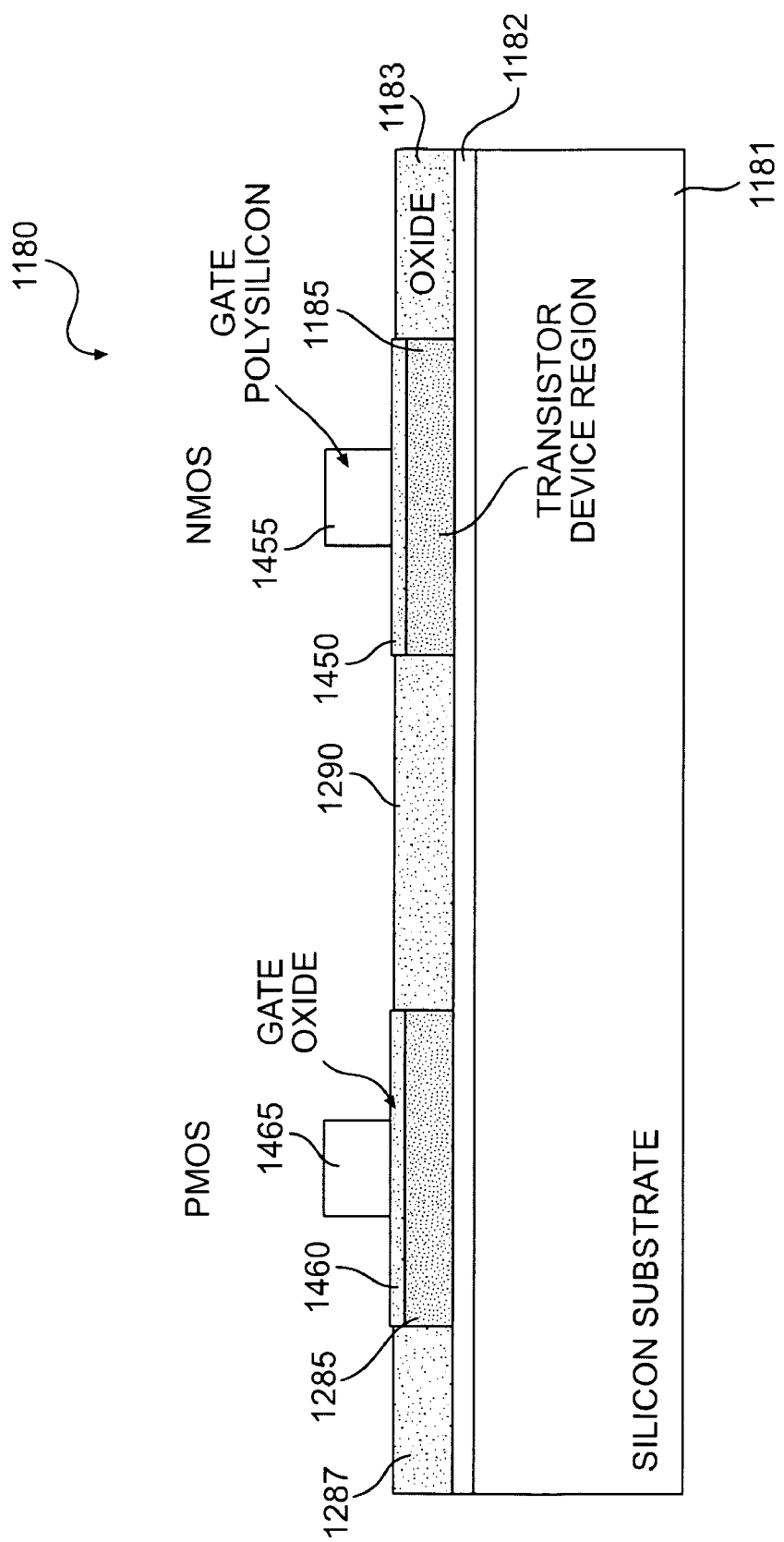

As shown in FIG. 13, a photoresist layer 1381 is deposited on the silicon device layer 1185, oxide region 1183 and portions of region 1290. PMOS channel doping is applied to the silicon device layer 1285 to create PMOS device channel regions to set a second threshold voltage for the device 1180. In FIG. 14, gate oxide layers 1460 and 1450 are grown on PMOS silicon device layer 1285 and NMOS silicon device layer 1185, respectively. Gate poly-silicon 1465 and 1455 is deposited and etched on gate oxide layers 1460 and 1450, respectively, to form PMOS and NMOS transistor gates.

Figure 15:
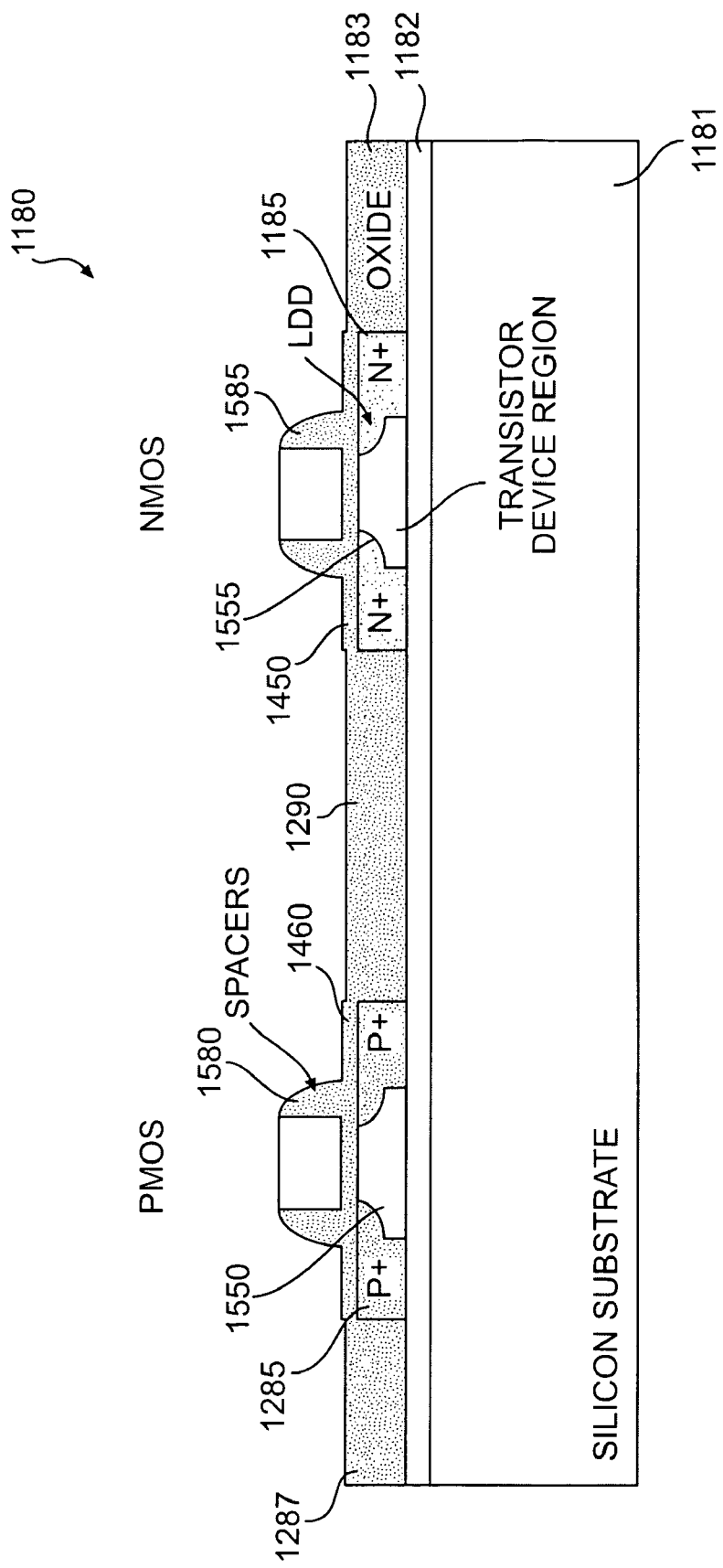
Figure 16:
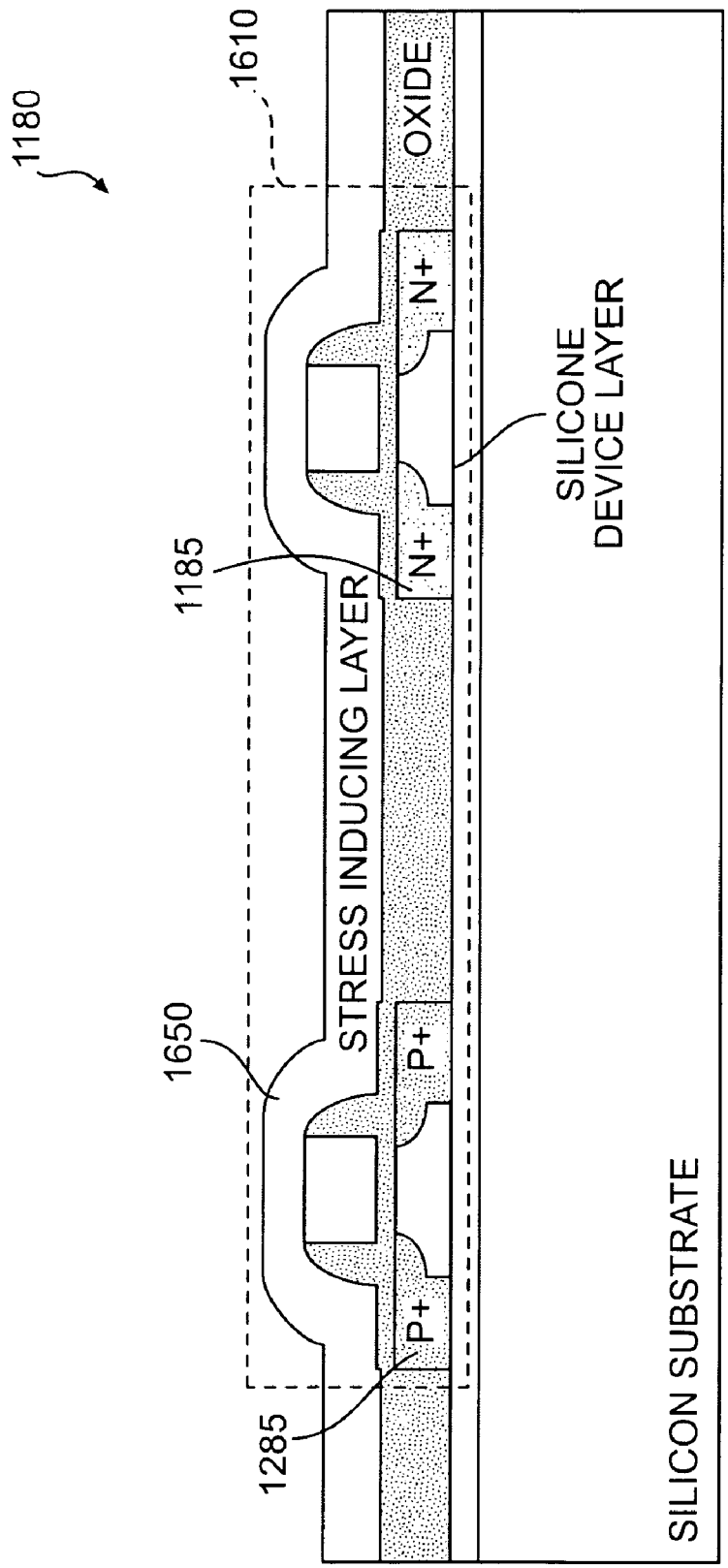
Figure 17:
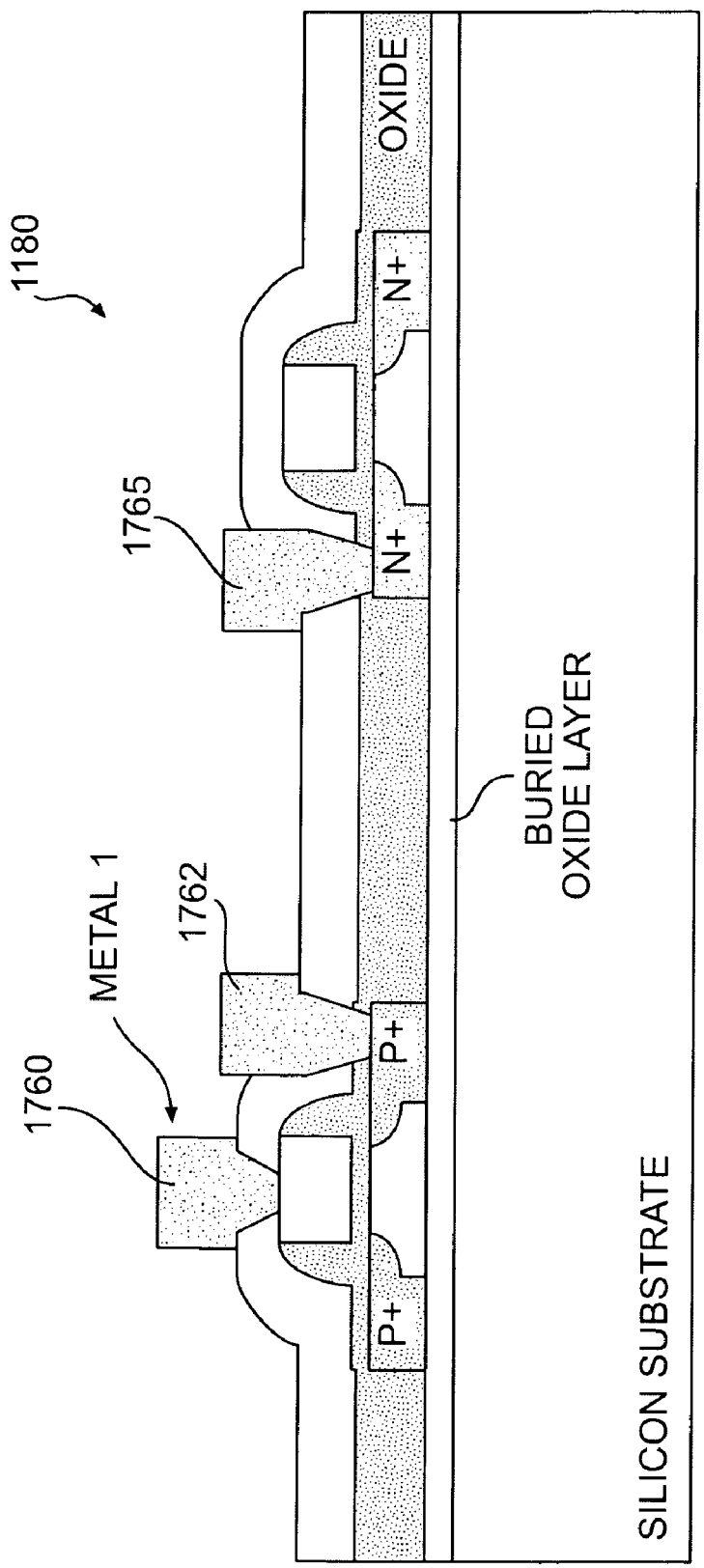
Figure 18:
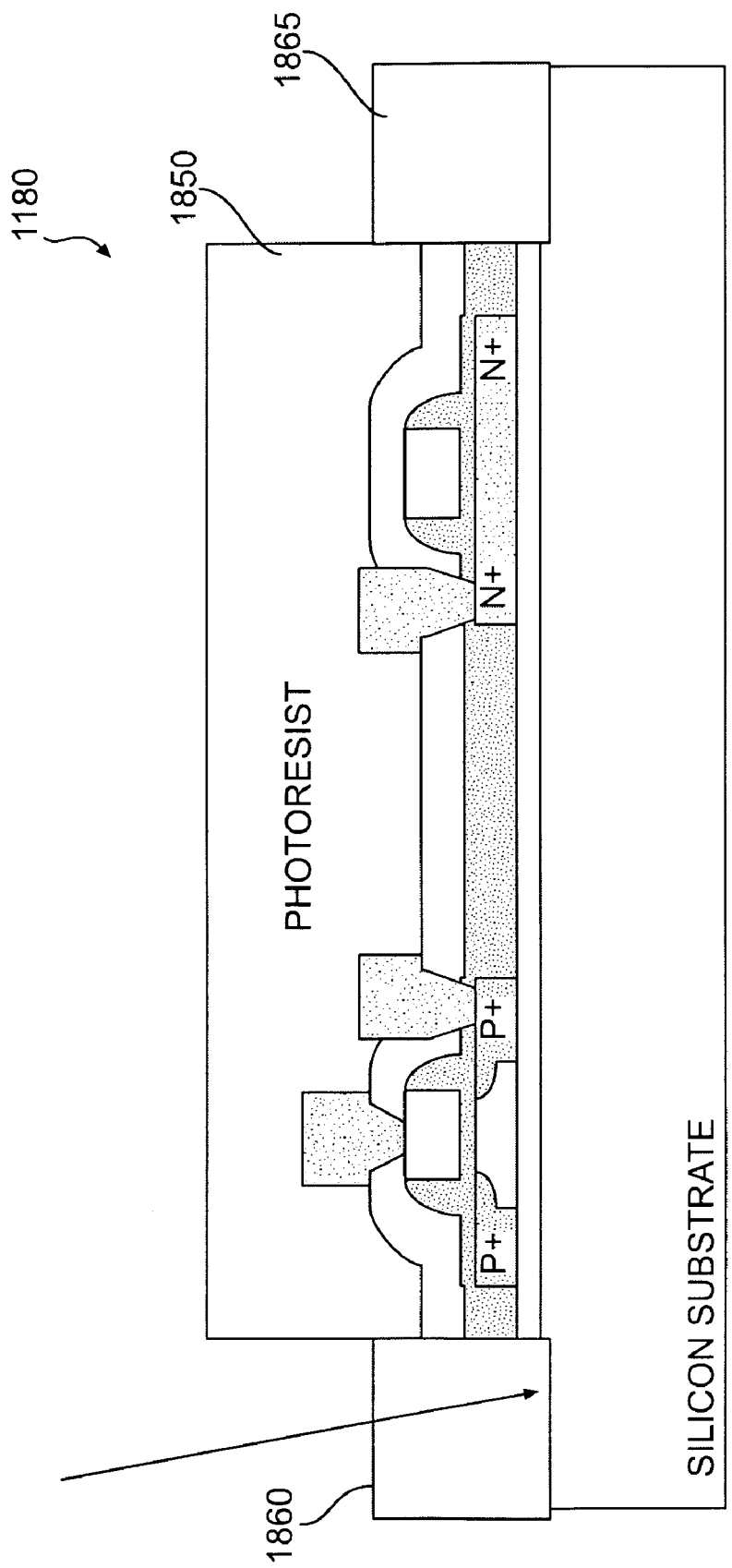
Figure 19:
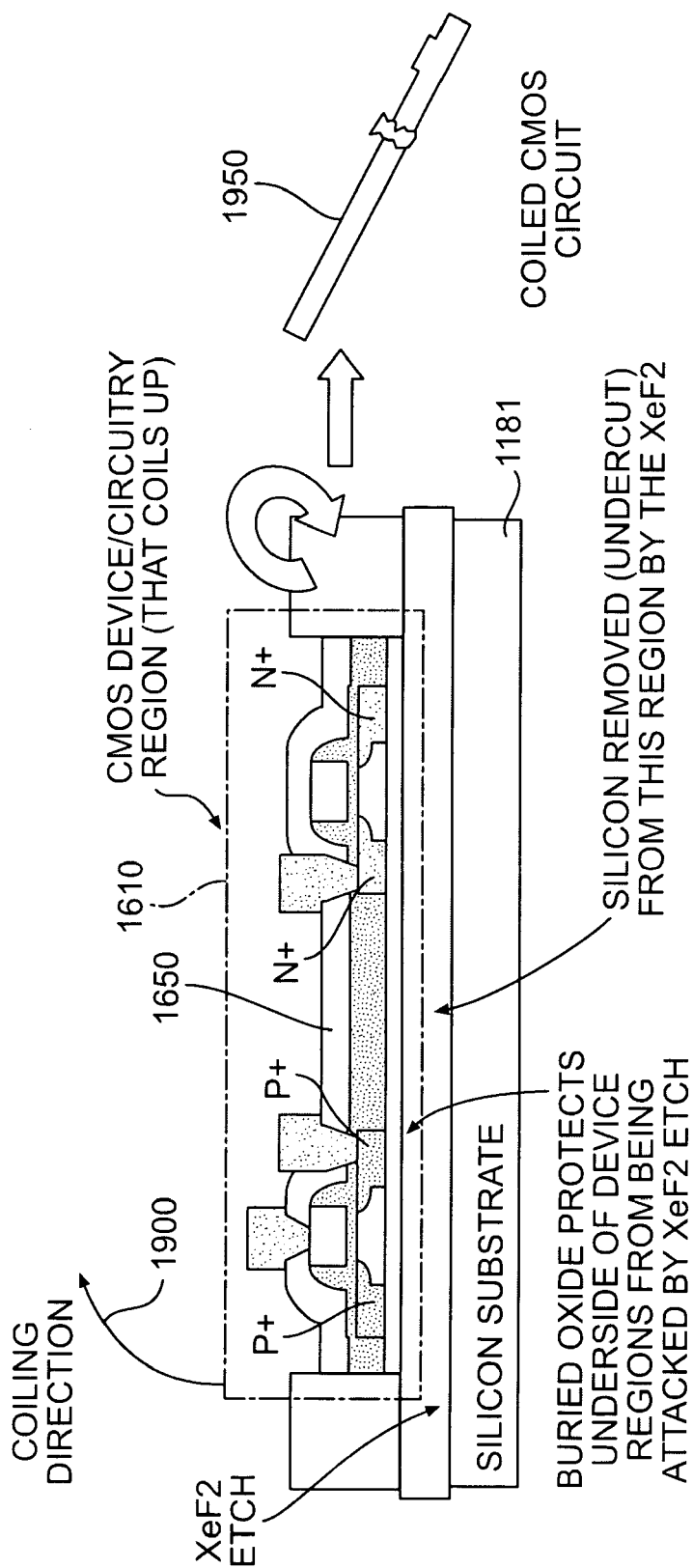

As shown in FIG. 15, NMOS lightly doped drain (NLDD) 1550 and PMOS lightly doped drain (PLDD) 1555 are implanted in PMOS silicon device layer 1285 and NMOS silicon device layer 1185, respectively. Spacers 1580 and 1585 are formed, and P+ regions 1285 and N+regions 1185 are implanted and activated. In FIG. 16, a stress inducing layer 1650 is deposited over the CMOS transistor structure 1610. The stress inducing layer 1650 provides dielectric isolation between metal layers (described below) and device regions 1285 and 1185. Contacts are etched and metal one layers 1760, 1762 and 1765 are deposited, as shown in FIG. 17. In FIG. 18, photoresist 1850 is deposited over the entire CMOS structure 1180. Openings 1860 and 1865 are etched for XeF$_2$ (Xenon Difluoride) to under cut the CMOS structure 1180, after the photoresist 1850 is removed, as shown in FIG. 19. As an alternate to photoresist other insulating materials that are not attacked by XeF$_2$—such as silicon dioxide—can be employed to encapsulate the active circuitry prior to XeF$_2$ release and coiling. Alternatively or additionally, the stress coiling layer can be provided by heavy implantation or diffusion of impurity layers at levels from 0.1% to 10% concentration of the Silicon Host Lattice. The layers can be controlled to provide either compressive or tension stress to coil the silicon circuit to the required outside radius. As shown, the XeF$_2$ etch is used to selectively etch the silicon substrate 1181 without etching the CMOS device circuitry region 1610. In this example, as the CMOS device circuitry is etched, the thin (e.g., approximately several microns) CMOS device circuitry region 1610 begins to coil in the direction shown by arrow 1900 due to the compression caused by the deposited stress inducing layer 1650. The device circuitry region 1610, once completely etched from the silicon substrate 1181 results in a coiled CMOS circuit 1950, as shown in FIG. 19.

Figure 20:
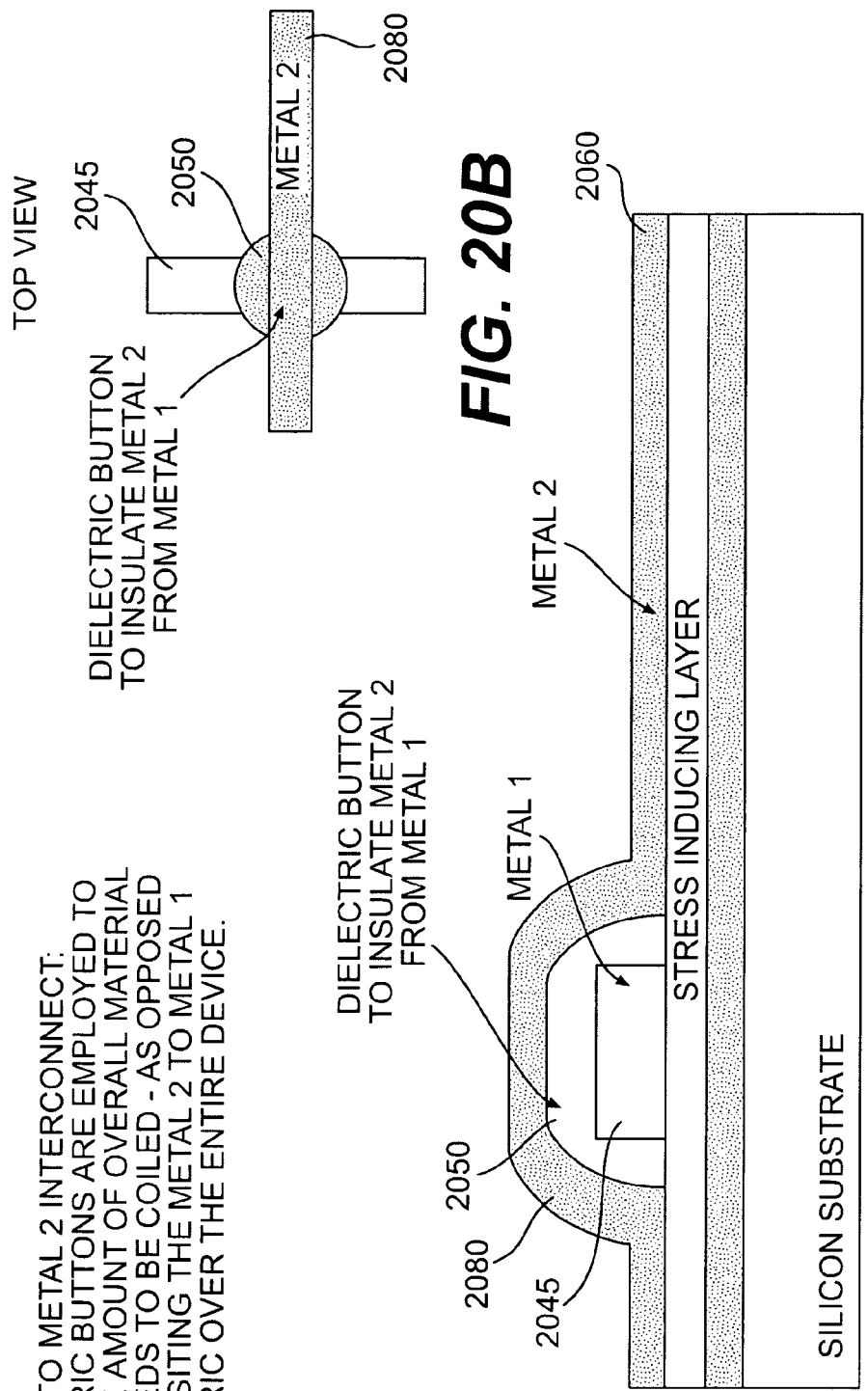
FIGS. 20A and 20B illustrate dielectric buttons that may be used in a coiled active circuit device.

As shown in FIG. 20A and 20B, dielectric buttons 2050 may be used to isolate, for example, contacts or other metal conductors metal 1 2045 from metal 2 2080. The dielectric buttons 2050 may be employed to limit the amount of overall material that needs to be coiled. In other words, as opposed to depositing a layer of dielectric over the entire device, the dielectric material is selectively deposited as dielectric buttons 2050 to keep the thickness of the device circuitry and thus the resulting coiled CMOS circuit device to a minimum, while maintaining isolation between metals. Dielectric buttons 2050 may be used to isolate, for example, metal X-Y address conductors, which may be used to maintain memory writing and reading speeds. By fabricating the thin X-Y address conductors out of metal (e.g., aluminum or gold), the X-Y line resistance can be kept acceptably low.

In order to achieve small device volume, a tight coil is desirable. Thus, very thin insulator layers may be used to achieve tight curling, which compounds the need for low resistance. Thin oxides and thin metal lines give RC read/write time-constants that are not much different than conventional fast memory, and yet allow the ability to wind the memory device into a tight coil.]

The above techniques, such as techniques for the CMOS integrated circuit formation, may be employed to create all types of active circuitry that can be included in the coiled CMOS circuit device. Although the above techniques with respect to creating CMOS integrated circuits only show creation of a single transistor region 1610, it is understood that the techniques described herein can be applied to create any number of transistors, circuits and/or devices. Moreover, all known and future circuit techniques as well as techniques for releasing the circuitry from the base substrate may be employed to create the coiled circuits and devices as described herein.

In one embodiment, to create coiled circuits and devices, the MOS circuit device region should be encapsulated by material that is not sensitive to $XeF_2$ etching, for example. The underlying substrate structure, on which the CMOS circuit device is configured, may ensure rapid lateral undercutting during the $XeF_2$ etch. Metal to be used in the circuitry should be flexible, low resistance and resistant to $XeF_2$ etching. For example, metals such as Chrome-Gold (Cr—Au) may be utilized along with titanium-Tungsten (Ti—W) or platinum (Pt) barrier material in the contact. The overall MOS device structure should be flexible for reliable cooling and the device layers should be as thin as possible so that a virtually imperceptible circuit device is formed.

Figure 21:
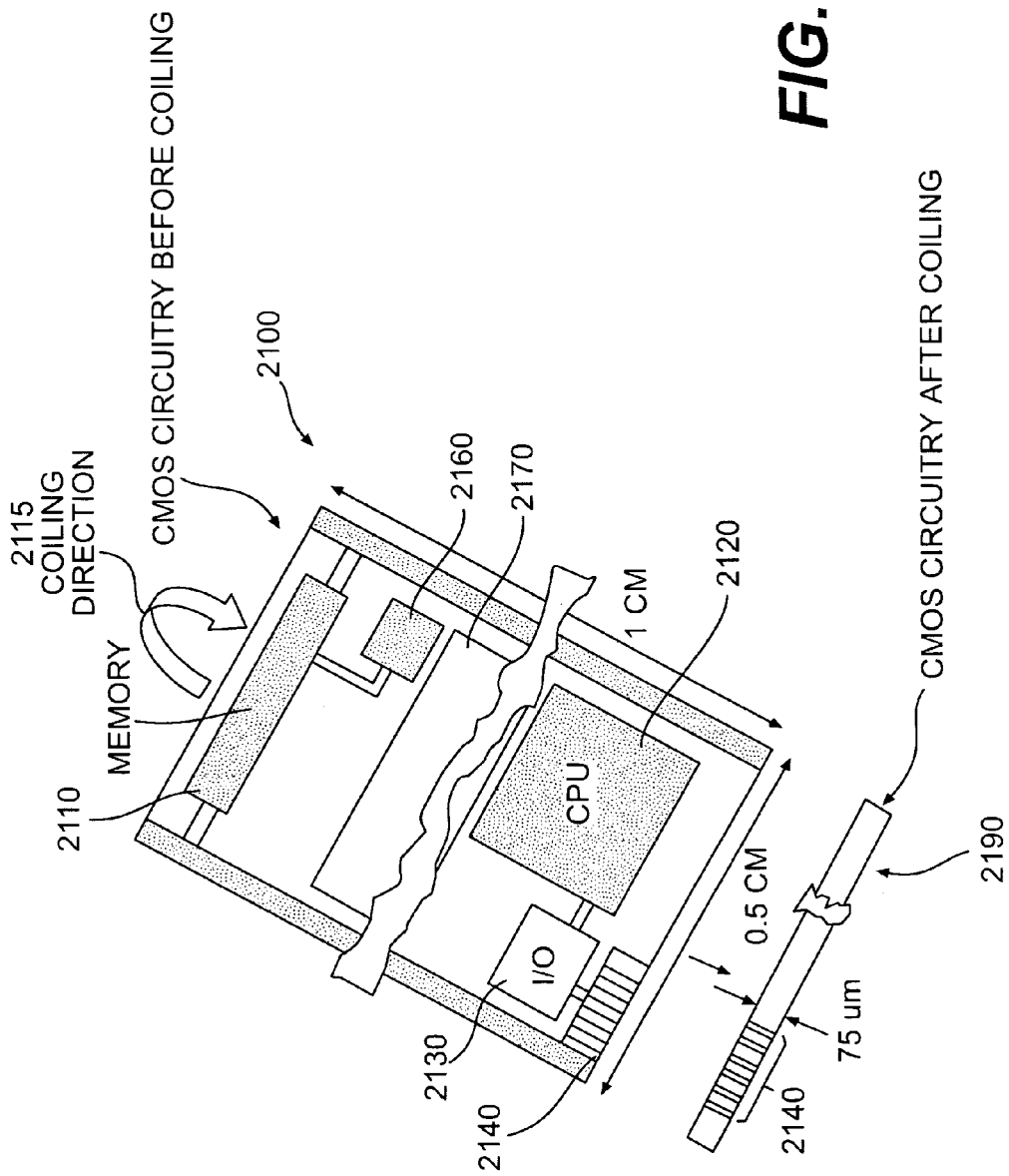
FIG. 21 is a diagrammatic representation of a circuit device before and after coiling, in accordance with an embodiment.

FIG. 21 shows a circuit device 2100 before and after coiling. As shown, the device may include, for example, memory 2100, central processing unit (CPU) 2120, input/output (I/O) device interface 2130 and external contacts 2140. The device 2100 may include additional components such as a power supply 2170, and/or additional memory or memory controller 2160, for example. The device 2100 may include additional components as described herein. The circuits and/or components of device 2100 may be created using any method including, but not limited to, the methods as described herein. In this example, the size of the device 2100 may be 1 cm in length, approximately 0.5 cm in width and several microns (μm) in thickness. As the circuitry 2100 is coiled, the resulting coiled CMOS circuit 2140, as shown in FIG. 21, may be formed. In this example, the coiled CMOS device 2140 is approximately 75 μm thick. Of course, the size of the CMOS device may vary depending on various parameters, such as the size and the number of components located on the device, the capabilities of the CMOS device and/or the methods used to create the active circuitry.

Figure 22:
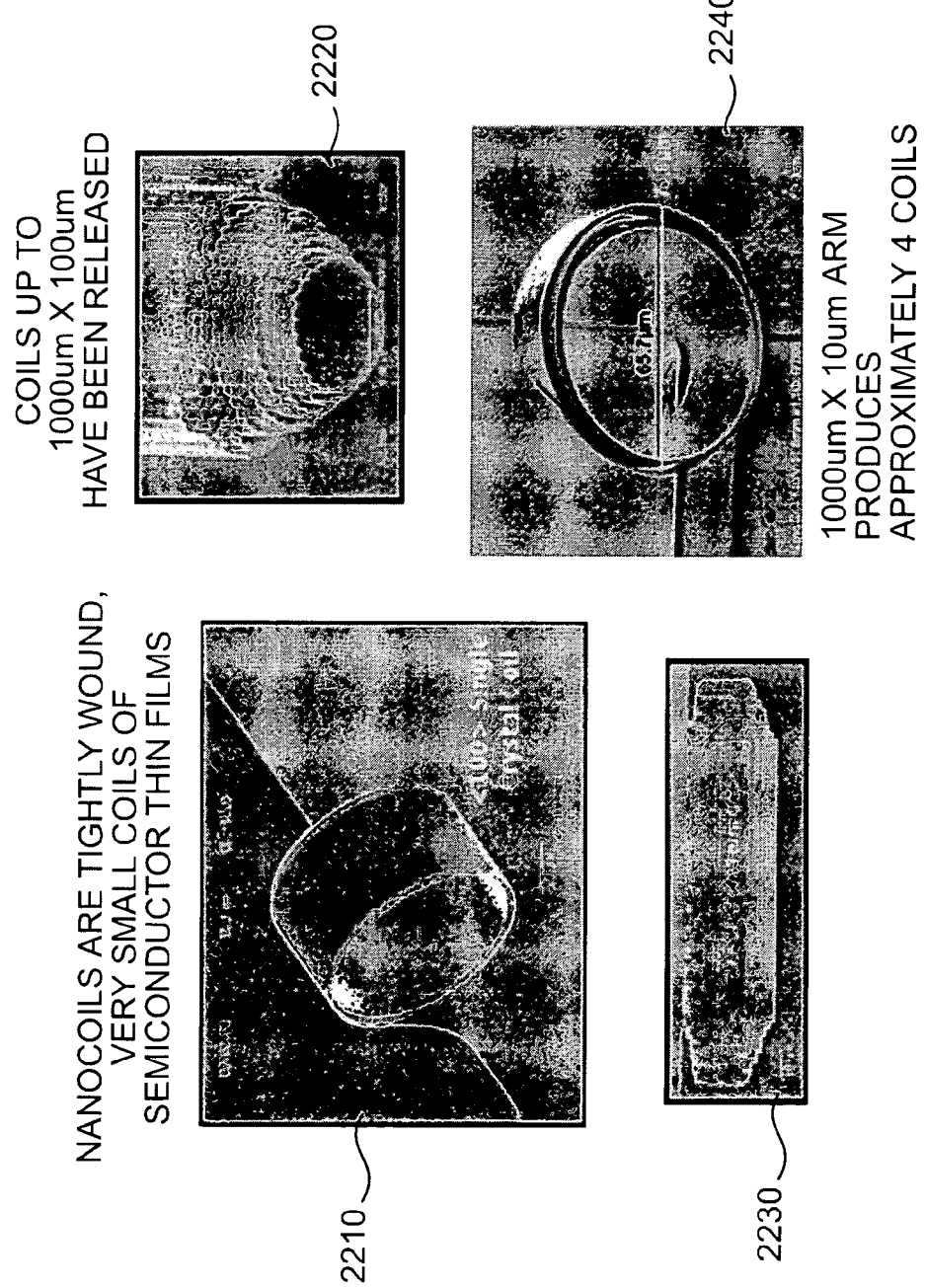
FIG. 22 shows electronic images of various nanocoils, in accordance with an embodiment.

FIG. 22 shows electronic images of nanocoils in accordance with an embodiment of the invention. Image 2210 shows a single coil on which circuit devices may be formed. Image 2220 shows a corrugated 13 coil, 1000 μm long polycrystalline coil, that may form a plurality of concentric circles, formed in accordance with an embodiment of the invention. Image 2230 shows a side view of a 13 turn coil. Image 2240 shows a coil having an inside diameter of approximately 65.7 μm and an outside diameter of approximately 75.8 μm.

Figure 23:
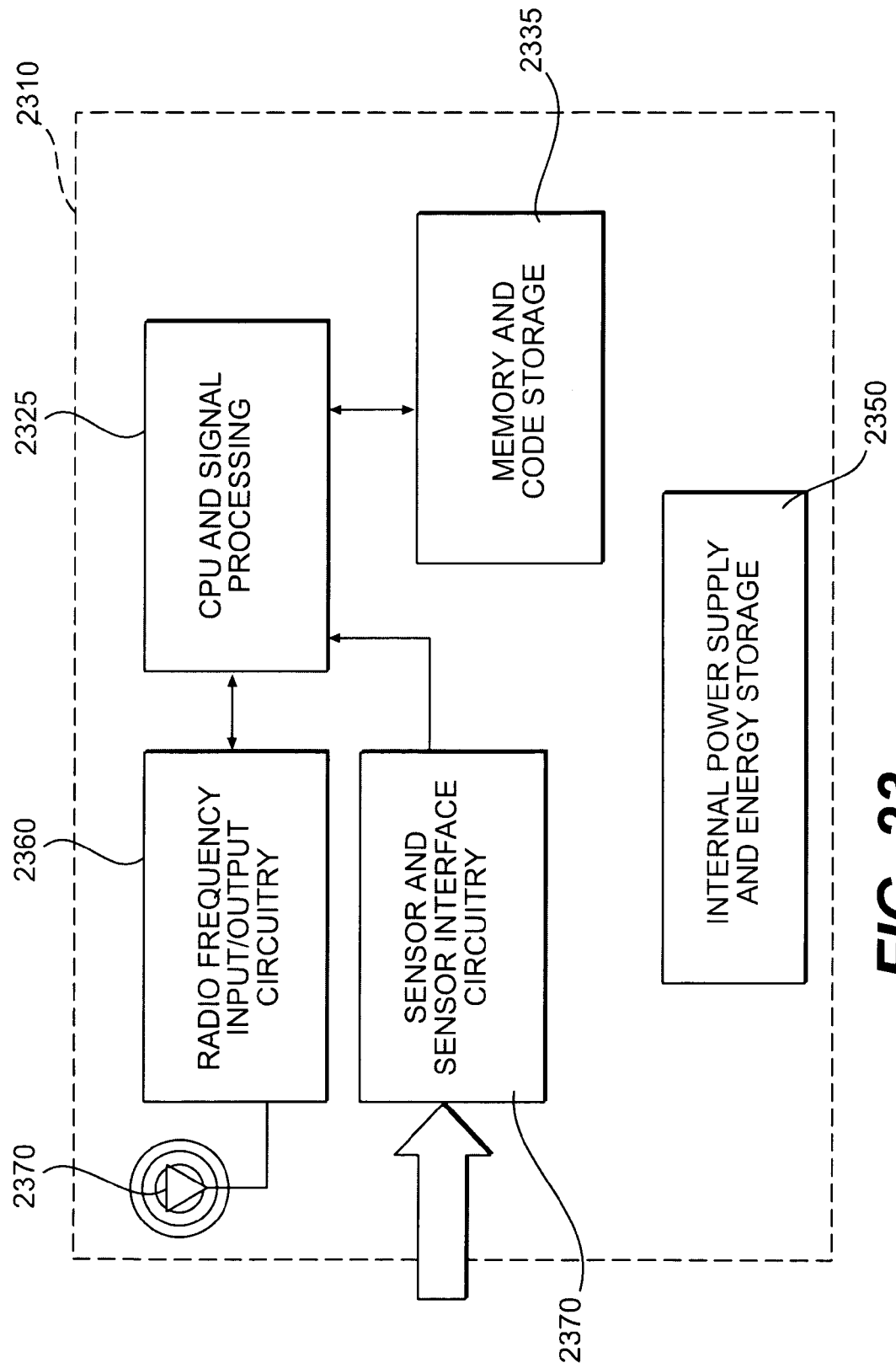
FIG. 23 is a block diagram of a coiled active circuit device, in accordance with an embodiment.

FIG. 23 is a block diagram of a coiled active circuit device 2310 in accordance with an embodiment. The device 2310 may include, for example, a central processing unit or signal processing unit 2325, memory unit 2335 (e.g., storage memory, OS code memory, etc.), internal power supply 2350 (or energy storage), sensor and sensor circuitry 2370, radio frequency input/output interface 2360 (e.g., transmitter and/or receiver) and antenna 2370. The sensor circuitry may be any appropriate circuitry to interface the sensor with the CPU/signal processor 2325. In an embodiment, the antenna 2370 may be used to transmit or receive signals. Components of system 2310 may be fabricated on a substrate and coiled into coiled circuit device, as described herein.

Figure 24:
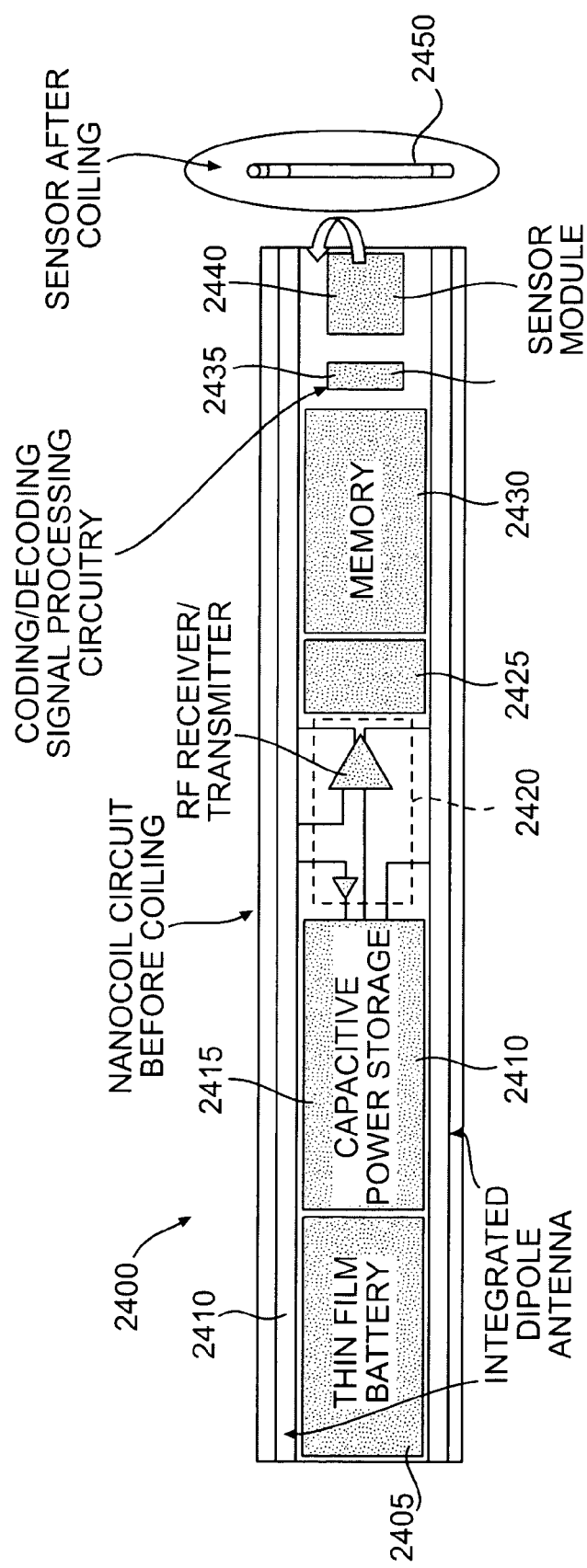
FIG. 24 shows a coiled active circuit device in accordance with an embodiment.

FIG. 24 shows a coiled active circuit device 2400 in accordance with an embodiment of the invention, before coiling. Also shown is the coiled circuit device after coiling 2450. The nanocoil circuit device 2400 may include, for example, a battery 2405 (e.g., a thin film battery), one or more integrated dipole antennas 2410, a capacitive power storage device 2415, a radio frequency receiver/transmitter 2420, processing unit 2425, memory 2430, coding/decoding signal processing circuitry 2435 and sensor 2440. In an embodiment, the nanocoil circuit device 2400 is fabricated and released from a substrate in accordance with methods and systems as described herein and related applications.

The transmitter/receiver 2420 may receive signals captured by the integrated dipole antenna(s) 2410 from an external transmitter. The received signals may be stored in memory 2430, and/or may be processed by processing unit 2425 and/or coding/decoding signal processing circuitry 2435. The transmitter/receiver 2420 may also transmit signals back to an external receiver using the integrated dipole antenna 2410. Further, the receiver/transmitter 2420 may receive signals, using antenna 2410, that may be used to charge the capacitive power storage device 2415 and/or thin film battery 2405, using techniques commonly employed in RFID circuits such as a Dickson charge pump. The sensor 2440 may be any type of sensor, such as an optical sensor, radiation sensor, thermal sensor, electromagnetic sensor, mechanical sensor (e.g., pressure sensor), chemical sensor, motion sensor, orientation or location sensor, distance sensor or any other type of sensor. Some of the sensors may employ MEMS (micro-electromechanical systems) technology. FIG. 24 also shows the nanocoil circuit device after coiling 2450.

In an embodiment, the coiled circuit devices described herein (e.g., device 2450) may be extremely small having an approximate size of, for example, 0.5 cm to 1 cm in length, and a diameter of 70 μm to 90 μm, when coiled. Of course, the coiled circuit devices can be made smaller or larger. The coiled circuit devices can, for example, transmit data to an external device, such as a receiver, or may even receive signals that may be used to charge a battery/power supply on the coiled circuit device.

In an embodiment, the battery 2405 may be a re-chargeable battery that may be re-charged by, for example, an RF signal received by transmitter/receiver 2420 via antenna(s) 2410. The capacitive power storage device 2410 may also be charged using signals received by the receiver 2420. The power storage device 2515 may receive and rectify pulsed 60 GHz RF energy. The processing unit 2425 and/or coding/decoding address chip 2435 may process data or signals received by transmitter/receiver 2520 via antenna(s) 2410. The memory may be any type of memory such as SRAM or Integrated non-volatile memory. The size of the memory may range from a few bytes to several megabytes or gigabytes or more.

In the FIG. 24 example, the coiled circuit device 2400 may be several millimeters, for example, 2 mm, in length, when coiled. FIG. 24 also shows the nanocoil circuit device after coiling 2450. The coiled cylinder forming the nanocoil sensor platform, described above, may act as a natural dipole antenna, that can be geared towards frequencies that are more easily used for RF communication over distance and through obstacles. For example, a nanocoil of approximately 6-8 cm in length acts as a reasonable antenna for 2-3 GHz communication. Smaller, millimeter long nanocoils may be used for line of sight communication using higher K-band communication.

With the coiling of microelectronic circuitry, as described herein, many types of sensors may be deployed, with the least complex being designed, for example, to detect certain chemicals. A simple sensor fabricated using the coiled circuit technology, as described herein, may return a single bit of data when externally queried or polled, or on its own initiative, or both. More complex sensors that include positional information may also be fabricated.

As described above, the increased surface area/volume ratio achieved by the coiled active circuit device provides increased area for the device power supply which may be supplied by thin film energy storage devices. The device power could be supplied from thin film batteries or high energy density thin film capacitors. The power source could be rechargeable, for example, deriving some of its power from ambient RF energy available from the surrounding environment. Operating the sensors at frequencies populated by commercial wireless signals (915 MHz, 2.4 GHz, and 5.7 GHz) also offers the opportunity to scavenge RF energy to re-charge the on-board energy source. In an embodiment, RF energy may be purposefully directed at the coiled circuit device as a way to recharge the onboard energy storage system. The collected RF input signal may be converted into DC supply voltage to power the coiled circuit device.

Device power requirements will determine how often the device power supply will require charging or the type of power supply required, or both. For example, if the coiled circuit device is employed as a sensor, the duty cycle for when the device is sensing (actively collecting information) and when the sensor is charging and/or transmitting, will determine the power requirements. For example, the sensor might capture (and store) data in a few microseconds. The next hour or so (depending on other parameters, such as the proximity of the receiver) may be spent charging an internal storage capacitor, located on the device, to enable a short burst RF transmission to the receiver, followed by another charge to provide enough energy for another round of data collection.

Coiled circuit device communications may be tied to the power requirements and power availability for the device. For example, the available power will determine how far data can be transmitted as well as how much data, and how often data can be transmitted to a remote receiver. Also, the long, cylindrical shape of the coiled circuit device may form a natural dipole antenna, that facilitates the transmit and receive functions of the coiled circuit device. The small size of the coiled circuit antenna may limit its gain, thereby limiting its transmit and receive distance. The centimeter length scale of the device may also favor operating at higher frequencies (Ka-band) which may be employed in line-of-sight applications. If the coiled device is made longer, such that either it is several centimeters in length or has an attached extension or tail, it may be more suitable for coupling with lower frequency (e.g. 1-6 GHz) signals.

The range and lifetime of sensor applications capturing smaller data sets would have significantly larger number of either transmissions or possible sensing range relative to more complex sensors. Further enhancements of the operational lifetime of these sensors for any of these applications may be achieved by sequentially querying individual sensors from a larger group of sensors in the same area, thus collecting the information needed while reducing the number of transmissions made by any single sensor. Trade-offs between power consumption and the sensor or device application may determine the communication requirements.

In an embodiment, a remote receiver may issue a wide area transmission signal, of a unique address, to a coiled circuit sensor which may switch that sensor into a transmit mode allowing the remote receiver to upload the data the coiled circuit sensor has collected. In other cases, an address may be transmitted activating a family of coiled circuit sensors, awakening one or more of the sensors. Receiving the signal, the one or more sensors may transmit the sensed or collected data to the remote receiver. The addressing chirp from the receiver may be used to initiate sensor action giving a remote observer control over the time and location of data collection. Using multiple sensors, may improve detection statistics, reduce the occurrence of false positives.

Figure 25:
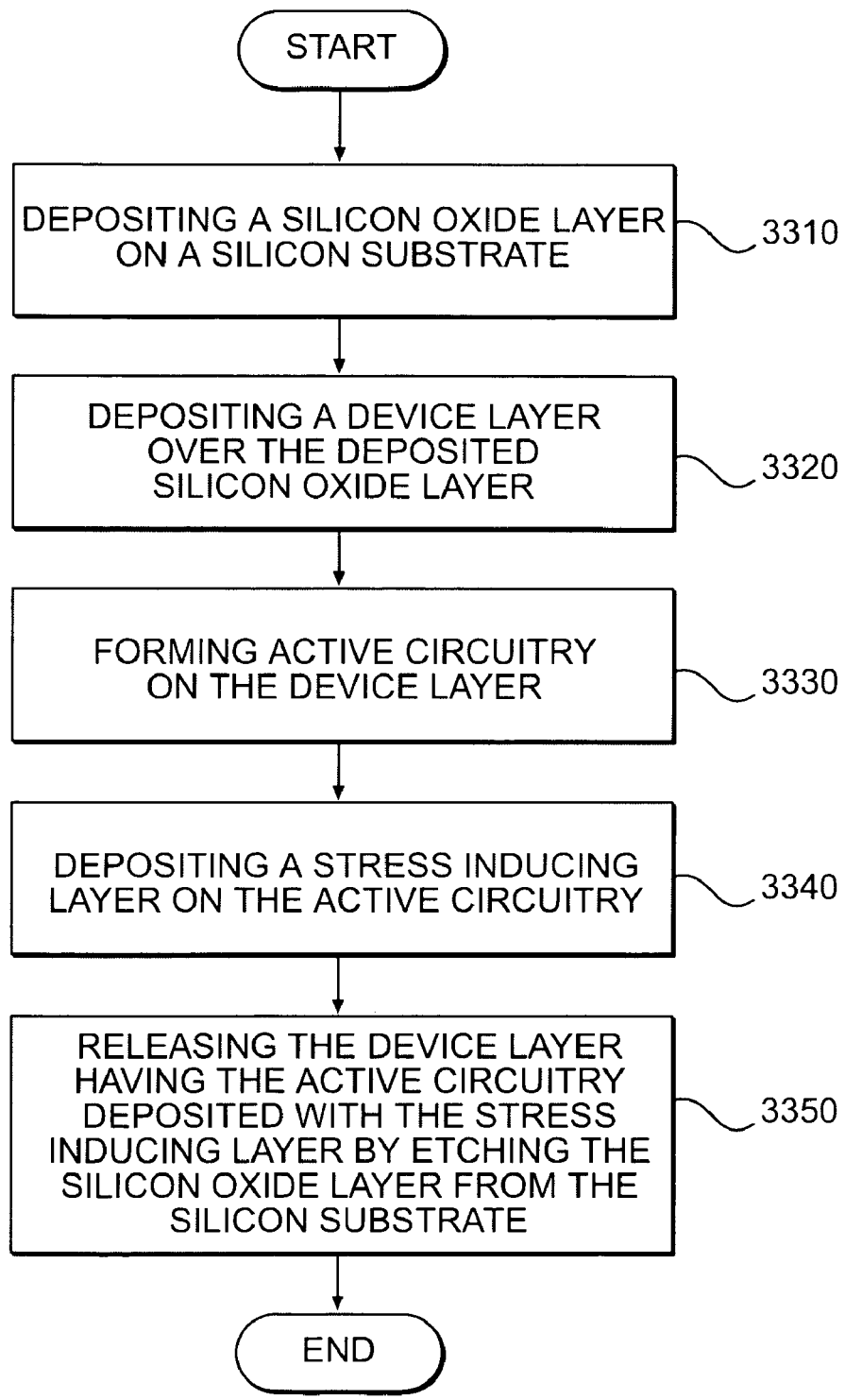
FIG. 25 is a flowchart illustrating a method for fabricating a coiled circuit device in accordance with an embodiment.

FIG. 25 is a flowchart illustrating a method for fabricating a coiled circuit device in accordance with an embodiment. As shown in 3310, a silicon oxide layer is deposited on a silicon substrate. A device layer is deposited over the silicon oxide layer, as shown in 3320. Active circuitry is formed on the device layer, as in 3330. A stress inducing layer is deposited on the active circuitry, as shown in 3340. The device layer having the active circuitry deposited with the stress inducing layer is released by etching the silicon oxide layer from the silicon substrate, as shown in 3350. The releasing of the active circuitry causes the device layer having the active circuitry deposited with the stress inducing layer to coil forming a plurality of concentric circles. The active circuitry forming the plurality of concentric circles is the coiled device that may be fabricated in accordance with an embodiment.

Figure 26:
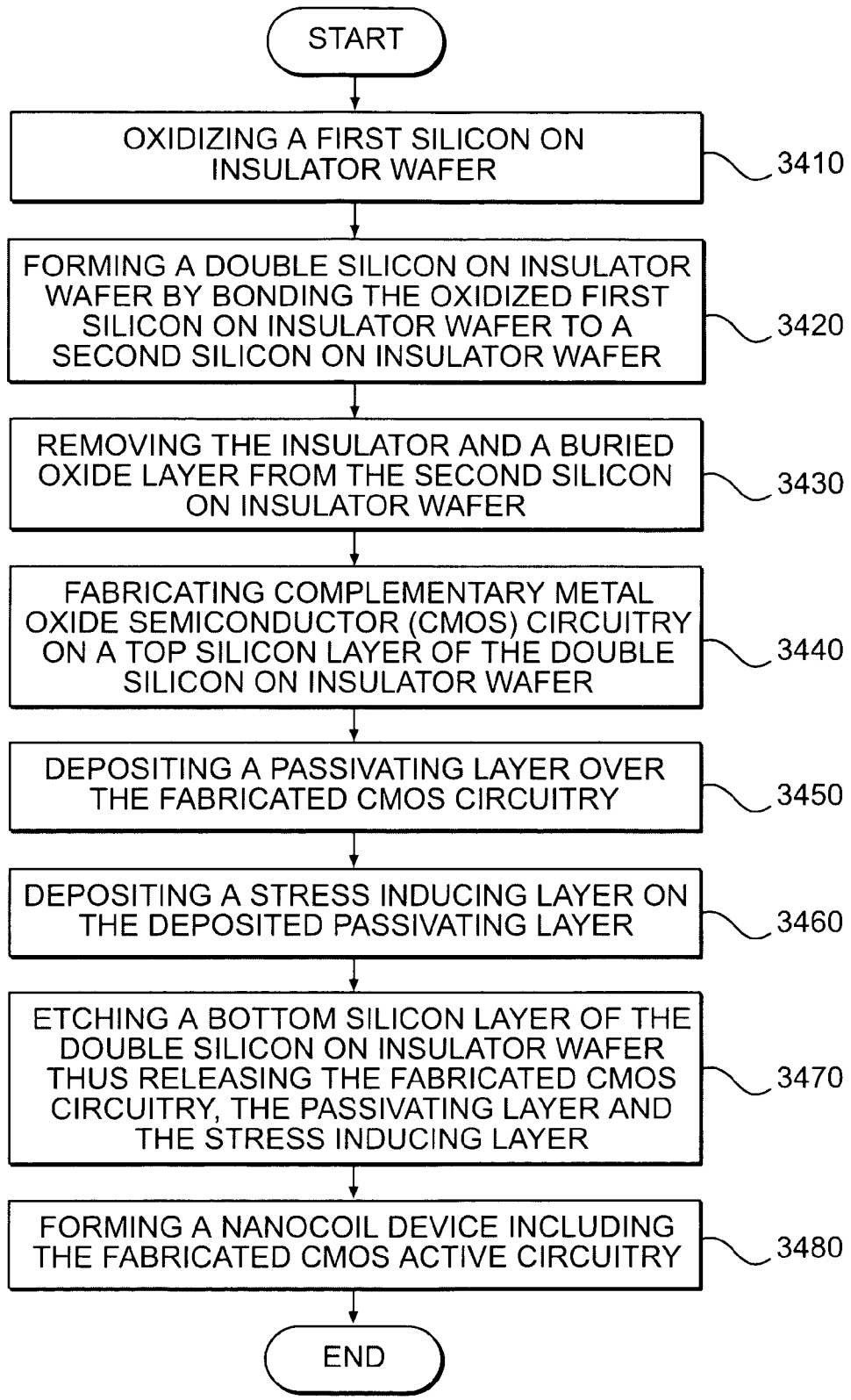
FIG. 26 is a flowchart illustrating a method for fabricating a coiled circuit device in accordance with an embodiment.

FIG. 26 is a flowchart illustrating a method for fabricating a coiled circuit device in accordance with an embodiment. As shown in 3410, a first silicon on insulator wafer is oxidized. A double silicon on insulator wafer is formed by bonding the oxidized first silicon on insulator wafer to a second silicon on insulator wafer, and removing the insulator and a buried oxide layer from the second silicon on insulator wafer, as shown in 3420 and 3430. Complementary metal oxide semiconductor (CMOS) circuitry is fabricated on a top silicon layer of the double silicon on insulator wafer, as shown in 3440. A passivating layer may be deposited over the fabricated CMOS circuitry, as in 3450. A stress inducing layer is deposited on the deposited passivating layer, as shown in 3460. A bottom silicon layer of the double silicon on insulator wafer is etched, thus releasing the fabricated CMOS circuitry, the passivating layer, and the stress inducing layer, as in 3470. As the fabricated CMOS circuitry, the passivating layer, and the stress inducing layer is released, a coil including the fabricated CMOS circuitry, the passivating layer and the stress inducing layer is formed, as in 3480.

Coiling or curling of an active circuit device is shown and described herein as resulting in a coiled device, which may be in a cylindrical form, forming a plurality of essentially concentric circles. However, the invention is not intended to be restricted to cylinder or circular type shapes. One will understand that other geometries can result form the coiling process, such as square or octagonal geometries, for example. Therefore, reference to "coiling" or "coiled" throughout this document is intended to cover other geometries than cylindrical or circular.

In an embodiment, the circuit device layer may have an approximate thickness of approximately 1000 angstroms. As a result, a complete coiled circuit device (as described herein) can be coiled into, e.g., a approximately 0.00005 cubic cm coil. The coiled device of this size may be virtually imperceptible but has the capacity to hold a large amount of circuitry and related hardware to, for example, capture, process, store and/or send and receive information. Various configurations and techniques may be employed to combine a plurality of coiled devices into a single device to create a super-dense integrated circuit device.

A number of techniques are contemplated for undercutting the sacrificial layer to achieve a tight coil. One embodiment of a process of removing the sacrificial layer and coiling the circuit includes a step of adding a temporary or permanent tapered etch shield to encourage progressive sacrificial etching from one end. As the sacrificial layer is undercut, the etch shield controls the rolling up of the sheet, causing coiling from the narrow end (e.g., right end) to the thicker end (e.g., left end), and prevents the corners of circuit sheet from curling. Etching may be, e.g., wet etching or dry etching. As described herein, multiple devices may be fabricated on a single wafer.

The etching shield may be adjusted in size and shape to achieve the desired effect. For example, the etching shield may be designed to prevent curling entirely at a certain point, in order to hold the coiled memory device to the wafer.

Thus, a number of preferred embodiments have been fully described above with reference to the drawing figures. Although the invention has been described based upon these preferred embodiments, it would be apparent to those of skilled in the art that certain modifications, variations, and alternative constructions would be apparent, while remaining within the spirit and scope of the invention.

For example, the coiling layer could be selected from other materials whose characteristics could effect coiling while the sacrificial layer is removed. Additionally, although the invention has been described in terms of memory devices, the present invention is certainly adaptable to coil many other types or circuits. Furthermore, although silicon (MOS) circuits were described, other types of coiled circuits are contemplated, such as radio frequency (RF) devices, GaAs and GaAs circuitry, silicon microprocessors. and other analog and digital circuitry.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A device comprising:
   a coiling layer including stressed silicon nitride;
   a circuit device layer;
   active microelectronic circuitry fabricated in the circuit device layer, wherein the coiling layer is formed onto a surface of and coupled to the circuit device layer, the coiling layer having intrinsic stresses which cause coiling of the coiling layer and the circuit device layer including the microelectronic circuitry as the circuit device layer is released from an underlying substrate.

2. The device of claim 1, wherein the circuit device layer comprises single crystal silicon.

3. The device of claim 2, wherein the active microelectronic circuitry is fabricated on the single crystal silicon.

4. The device of claim 1, wherein the active microelectronic circuitry comprises thin complementary metal oxide semiconductor (CMOS) circuitry.

5. The device of claim 1, wherein the coiling layer comprises nitride.

6. The device of claim 1, wherein the active microelectronic circuitry comprises:
   one or more of a thin film battery, processor, memory, radio frequency receiver, radio frequency transmitter, microelectronic mechanical systems (MEMS), capacitive storage system, antenna, and logic gates.

7. The device of claim 1, wherein the active microelectronic circuitry comprises:
   a dipole antenna.

8. The device of claim 1, wherein the active microelectronic circuitry comprises:
   one or more environmental sensors, wherein the environmental sensor includes one or more of a pollution and chemical sensor.

9. The device of claim 1, wherein the coiling layer, the circuit device layer and the active microelectronic circuitry is less than 1000 angstroms (Å) in thickness.

10. The device of claim 1, wherein the device ranges from 1 μm to 10000 μm in diameter, and ranges from 1 μm to 1 cm in length.

11. A coiled circuit device comprising:
    a coiling layer including stressed silicon nitride;
    a circuit device layer, wherein the circuit device layer comprises single crystal silicon; and
    active microelectronic circuitry fabricated on the single crystal silicon, wherein the active microelectronic circuitry comprises thin complementary metal oxide semiconductor (CMOS) circuitry, and the coiling layer is formed onto a surface of and coupled to the circuit device layer, the coiling layer having intrinsic stresses which cause coiling of the coiling layer and the circuit device layer when the circuit device layer is released from an underlying substrate.

12. The coiled circuit device of claim 11, wherein the active microelectronic circuitry comprises:
    one or more of a thin film battery, processor, memory, radio frequency receiver, radio frequency transmitter, microelectronic mechanical systems (MEMS) capacitive storage system, antenna and logic gates.

13. The coiled circuit device of claim 11, wherein the active microelectronic circuitry comprises:
    a dipole antenna.

14. The coiled circuit device of claim 11, wherein the active microelectronic circuitry comprises:
    one or more environmental sensors, wherein the environmental sensor includes one or more of a pollution and chemical sensor.

15. The coiled circuit device of claim 11, wherein the coiling layer, the circuit layer and the active microelectronic circuitry is less than 1000 angstroms (Å) in thickness.

16. The coiled circuit device of claim 11, wherein the coiled circuit device ranges from 1 μm to 10000 μm in diameter, and ranges from 1 μm to 1 cm in length.

* * * * *